United States Patent
Kanno et al.

(10) Patent No.: US 7,301,418 B2
(45) Date of Patent: Nov. 27, 2007

(54) DIFFERENTIAL TRANSMISSION LINE HAVING CURVED DIFFERENTIAL CONDUCTORS AND GROUND PLANE SLOTS

(75) Inventors: Hiroshi Kanno, Osaka (JP); Kazuyuki Sakiyama, Osaka (JP); Ushio Sangawa, Nara (JP); Tomoyasu Fujishima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/601,707

(22) Filed: Nov. 20, 2006

(65) Prior Publication Data
US 2007/0063782 A1 Mar. 22, 2007

Related U.S. Application Data

(63) Continuation of application No. PCT/JP2006/312520, filed on Jun. 22, 2006.

(30) Foreign Application Priority Data
Jun. 28, 2005 (JP) .............................. 2005-187663

(51) Int. Cl.
*H01P 3/08* (2006.01)
(52) U.S. Cl. .......................................... 333/4; 333/246
(58) Field of Classification Search ................ 333/1, 333/4, 5, 238, 246
See application file for complete search history.

(56) References Cited

U.S. PATENT DOCUMENTS 6,347,041 B1 * 2/2002 Hailey et al. ............... 361/777
6,496,081 B1 * 12/2002 Govind et al. ............. 333/28 R
6,590,466 B2 * 7/2003 Lin et al. ....................... 333/1

(Continued)

FOREIGN PATENT DOCUMENTS

EP  1 376 747 A2  1/2004

(Continued)

OTHER PUBLICATIONS

Franz Gisin, et al., "Routing Differential I/O Signals Across Split Ground Planes at the Connector for EMI Control," 2000 IEEE International Symposium on Electromagnetic Compatibility, Aug. 2000, pp. 325-327, vol. 21-25, IEEE.

(Continued)

*Primary Examiner*—Benny Lee
(74) *Attorney, Agent, or Firm*—McDermott Will & Emery LLP

(57) ABSTRACT

A differential transmission line includes: a substrate; a ground conductor layer; and a first and a second signal conductor disposed in parallel to each other on the substrate. The first signal conductor and the ground conductor layer compose a first transmission line, whereas the second signal conductor and the ground conductor layer compose a second transmission line. The first transmission line and the second transmission line compose a differential transmission line. The differential transmission line includes a curved region, with a straight region being connected to each end of the curved region. In the ground conductor layer in the curved region, a plurality of slots orthogonal to a local transmission direction of signals in the curved region are formed, and the slots are connected to one another on the inner side of the curvature.

8 Claims, 24 Drawing Sheets

U.S. PATENT DOCUMENTS

| 6,703,907 B1 | 3/2004 | van der Wagt |
|---|---|---|
| 2004/0000959 A1* | 1/2004 | Howard et al. ................ 333/4 |
| 2005/0040846 A1 | 2/2005 | Otsuka et al. |

FOREIGN PATENT DOCUMENTS

| GB | 2 345 583 A | 7/2000 |
|---|---|---|
| JP | 6-104612 A | 4/1994 |
| JP | 7-283621 A | 10/1995 |
| JP | 2000-151218 A | 5/2000 |
| JP | 2004-48750 A | 2/2004 |
| JP | 2004-304233 A | 10/2004 |
| JP | 2005-51496 A | 2/2005 |

OTHER PUBLICATIONS

M. Kirschning, "Measurement and Computer-Aided Modeling of Mictrostrip Discontinuities by an Improved Resonator Method," 1983 IEEE MTT-S International Microwave Symposium Digest, May 1983, p. 495-497, IEEE.

A. Weisshaar, et al., "Modeling of Radial Microstrip Bends," 1990 IEEE MTT-S International Microwave Symposium Digest, May 1990, pp. 1051-1054, IEEE.

* cited by examiner

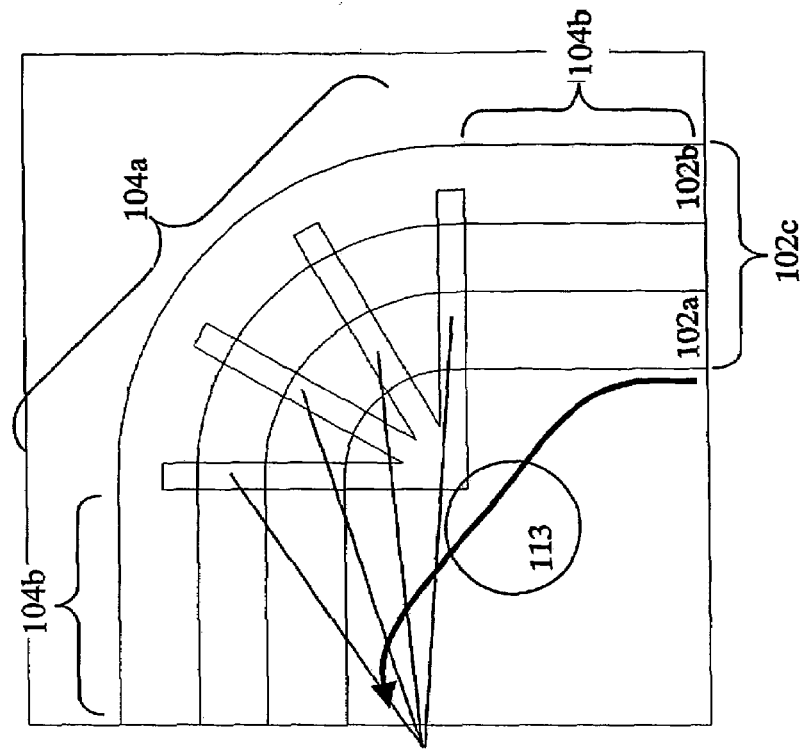
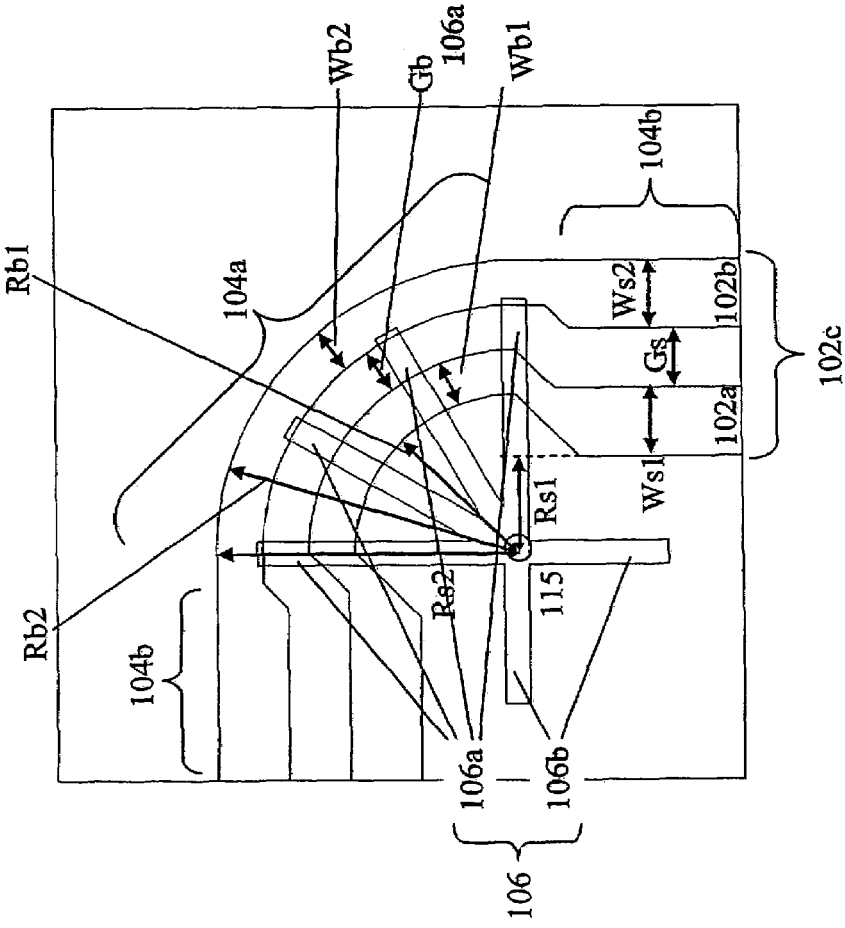
FIG. 7A
FIG. 7B

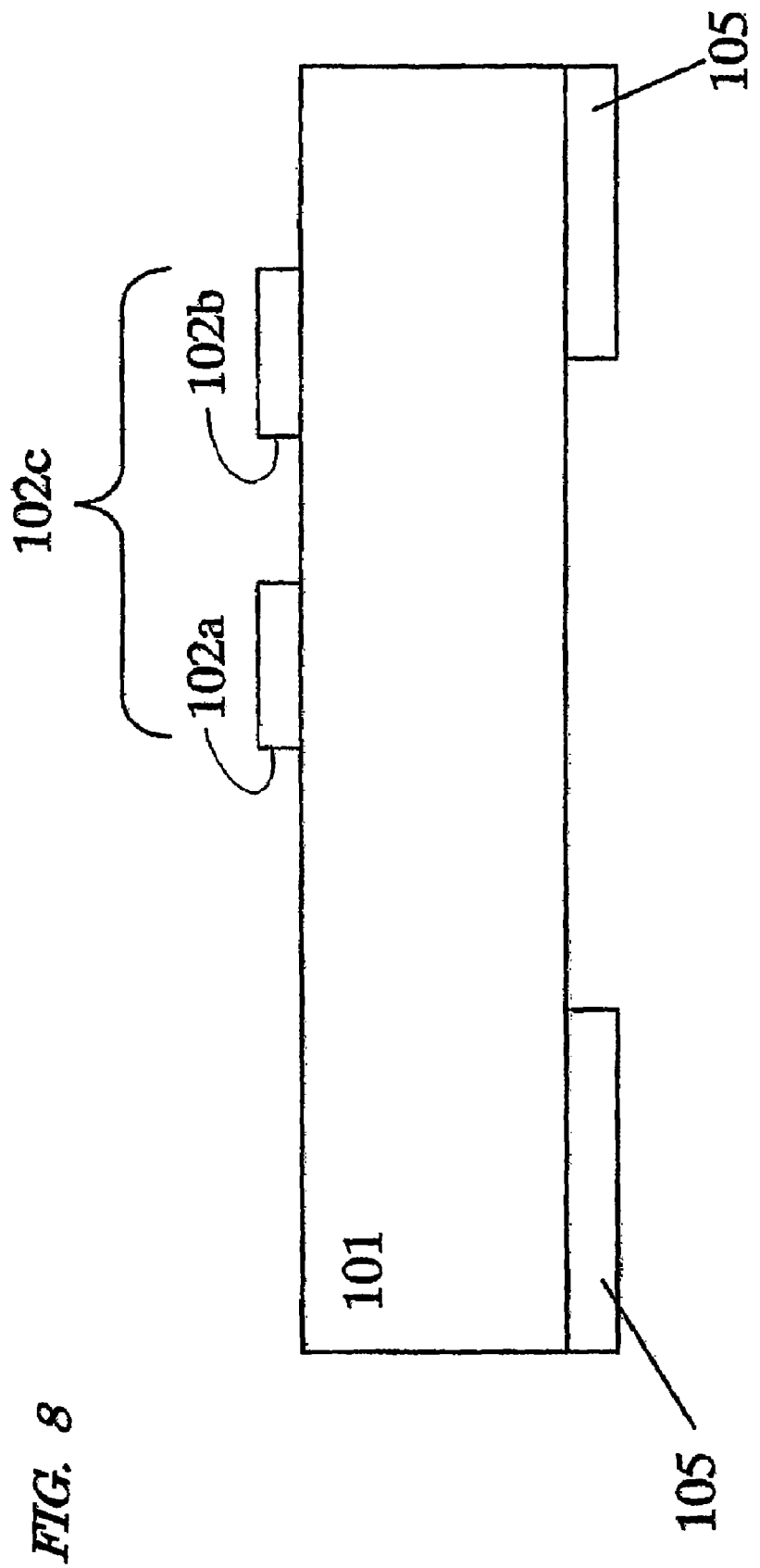

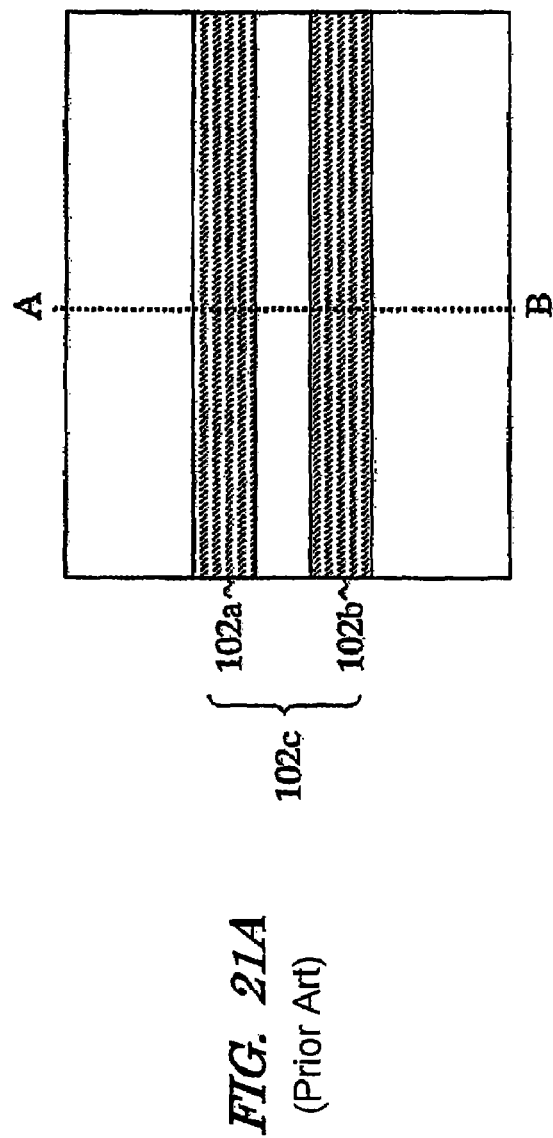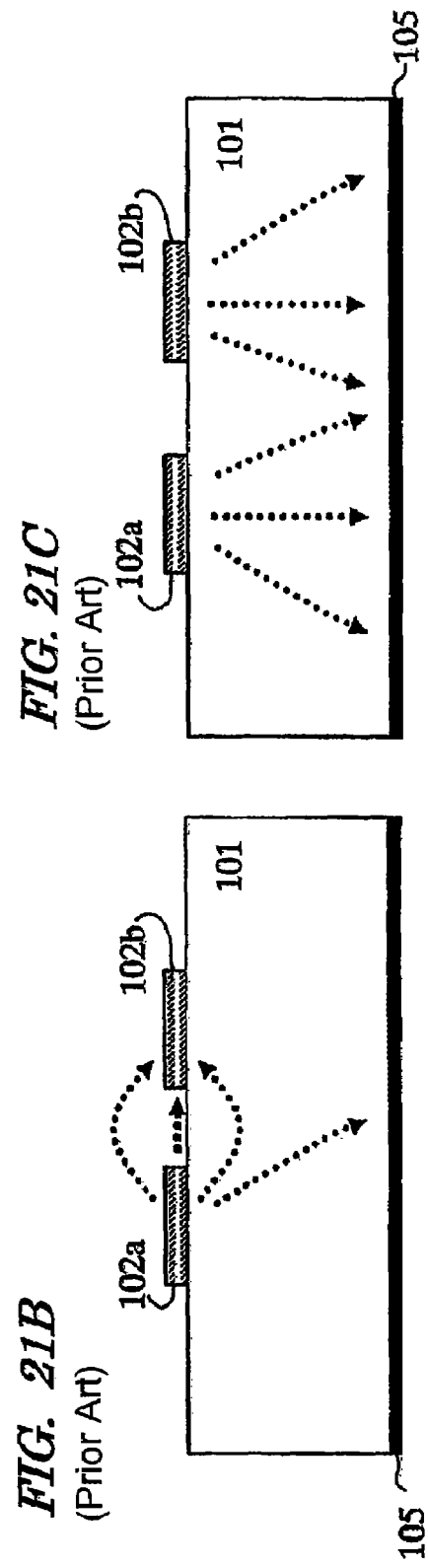
FIG. 21A (Prior Art)
FIG. 21B (Prior Art)
FIG. 21C (Prior Art)

DIFFERENTIAL TRANSMISSION LINE HAVING CURVED DIFFERENTIAL CONDUCTORS AND GROUND PLANE SLOTS

This is a continuation of International Application No. PCT/JP2006/312520 with an international filing date of Jun. 22, 2006, which claims priority of Japanese Patent Application No. 2005-187663, filed on Jun. 28, 2005, the contents of which are hereby incorporated by reference.

BACKGROUND OF THE INVENTION

1. Field of the Invention

The present invention relates to a differential transmission line, and more particularly to a differential transmission line for transmitting an analog high frequency signal of a microwave range and an extremely high frequency range, or a digital signal.

2. Description of the Related Art

Differential signal transmission is less prone to radiation than the conventionally-used single-ended signal transmission, and is immune to noise. Therefore, differential signal transmission is beginning to be used for high-speed signal transmission. FIG. 21A is an upper plan view showing the transmission line structure of a differential transmission line. FIG. 21B and FIG. 21C are cross-sectional views taken along line A-B in FIG. 21A.

The illustrated structure includes a circuit board 101 and a ground conductor layer 105 which is formed on an inner layer face or a rear face of the circuit board 101 as depicted in FIGS. 21B and 21C. On an inner layer face or a front face of the circuit board 101, two signal conductors 102a and 102b are formed. High frequency signals of opposite signs are supplied to the two signal conductors 102a and 102b, so that they function together as a differential transmission line 102c.

The signal conductor 102a and the ground conductor layer 105 compose a first transmission line (microstrip line), whereas the signal conductor 102b and the ground conductor layer 105 compose a second transmission line (microstrip line). The differential transmission line is composed of this pair of transmission lines.

When two microstrip lines are placed adjacent and in parallel to each other and allowed to couple, two modes will occur: an even mode, where signals in the same direction are transmitted through the two microstrip lines; and an odd mode, where signals in opposite directions are transmitted through the two microstrip lines. In a differential transmission line, signals are transmitted by utilizing the odd mode.

FIG. 21B schematically shows directions of electric-field vectors under the odd mode with arrows. FIG. 21C schematically shows directions of electric-field vectors under the even mode with arrows.

Under the odd mode, as shown in FIG. 21B, electric-field vectors generally head from the one signal conductor 102a toward the other signal conductor 102b, while the electric-field vector heading from the signal conductor 102a toward the ground conductor 105 has only a small magnitude. Therefore, in differential transmission under the odd mode, transmission characteristics are not likely to be greatly influenced by any change in the structure of the ground conductor 105. In differential transmission under the odd mode, a virtual ground plane is formed at a symmetric plane between the two signal conductors 102a and 102b.

On the other hand, the even mode illustrated in FIG. 21C corresponds to an in-phase mode, which is unwanted in differential transmission. Transmission under the in-phase mode suffers from a drastically increased unwanted radiation as compared to transmission under the differential mode (odd mode). Therefore, the in-phase mode must be suppressed. A stronger coupling occurs between the two transmission lines of a differential transmission line pair as the distance between the signal line 102a and the signal line 102b becomes shorter. Therefore, in order to suppress the even mode, it is effective to reduce the gap between the signal line 102a and the signal line 102b.

However, the fabrication process imposes limits to reducing the gap between the lines, thus making complete suppression of the even mode impossible. Therefore, when designing a differential transmission line, it is imperative to employ a circuit design which prevents any input differential signal from being converted into an in-phase signal. For example, in order for two signals which are input in opposite phases and with an equal amplitude to retain their opposite phases and equal amplitude, it is necessary to maintain circuit symmetry between the two signal lines 102a and 102b, through which the respective signals are transmitted. In other words, the two signal lines 102a and 102b composing the differential transmission line must be two lines which are identical in terms of both amplitude characteristics and phase characteristics.

However, at a curved region of a differential transmission line (i.e., a curving region of the two signal lines 102a and 102b), unwanted mode conversion from a differential signal to an in-phase signal is likely to occur.

Japanese Laid-Open Patent Publication No. 2004-48750 (hereinafter "Patent Document 1") discloses a method for removing an unwanted in-phase signal which has been superposed on a differential transmission line. With reference to FIG. 22, the construction disclosed in Patent Document 1 will be described.

In the example shown in FIG. 22, a plurality of slots 121 are formed in a ground conductor layer which lies immediately under a differential transmission line 102c. The slots 121 extend in a direction which is orthogonal to a transmission direction 125 of differential signals. By adopting such a construction, the impedance with respect to the in-phase signal is selectively increased, whereby the in-phase signal is reflected.

In transmission under the differential mode, a virtual high frequency ground plane is formed between the two signal conductors 102a and 102b composing the differential transmission line 102c. Therefore, there is little influence on the transmission characteristics resulting from forming the slots 121 in the ground conductor layer 105. Hence, in the differential transmission line described in Patent Document 1, it is possible to reduce the passing intensity of the in-phase signal without unfavorably affecting the transmission characteristics in the differential mode.

Patent Document 1 also discloses a method for removing an in-phase signal in a curved region of a differential transmission line. Specifically, Patent Document 1 describes that, not only when the differential transmission line has a linear shape but also when it has a curved shape, an in-phase signal can be effectively removed by forming a slot 123 in a direction which is orthogonal to a local transmission direction 127 of a signal. On the other hand, "Routing differential I/O signals across split ground planes at the connector for EMI control", 2000 IEEE International Symposium on Electromagnetic Compatibility, August 2000 vol. 21-25, pp. 325-327 (hereinafter "Non-Patent Document 1") discloses principles of in-phase mode removal by forming slots in the ground conductor.

However, although the aforementioned conventional technique is able to reduce the intensity of an in-phase signal which passes through the differential transmission line in response to an input in-phase signal, the technique does not concern "unwanted mode conversion intensity", which represents an in-phase signal which is output in response to an input differential signal.

"Measurement and computer-aided modeling of microstrip discontinuities by an improved resonator method", 1983 IEEE MTT-S International Microwave Symposium Digest, May 1983, pp. 495-497 (hereinafter "Non-Patent Document 2") discloses that, in a curved region of a single-ended transmission line, transmission characteristics are improved by removing a corner 129 of a signal conductor 102d, as shown in FIG. 23. Generally speaking, a ground capacitance which is created between a signal conductor and a ground conductor tends to increase in a curved region of a transmission line, as compared to a straight region. Thus, transmission characteristics are improved by reducing the area of the signal conductor 102d in a curved region. This technique is widely used in the present-day high frequency circuit designs. Software for producing a layout view from a circuit diagram, for example, is often configured so as to automatically remove the corner of any curved region of a signal conductor.

"Modeling of radial microstrip bends", 1990 IEEE MTT-S International Microwave Symposium Digest, May 1990, pp. 1051-1054 (hereinafter "Non-Patent Document 3") reports the high-frequency characteristics of a circuit structure which exhibits good values as to the transmission characteristics of a curved region of a single-ended transmission line in a high frequency band. While the construction of Non-Patent Document 2 may suffer from reflection of the transmission signal in a high frequency band, the construction of Non-Patent Document 3 improves the high-frequency characteristics by smoothly bending a signal conductor around an assumed center of curvature at a curved region of a transmission line. Such a construction is also commonly used in a high frequency circuit for transmitting signals of an especially high frequency.

A curved region of a differential transmission line 102c with first signal conductor 102a and second signal conductor 102b shown in FIG. 24A can be realized based on the disclosure of Patent Document 1. The curved region shown in FIG. 24A has a circuit structure that corresponds to the circuit structure of the curved region shown in FIG. 22 from which the slots 123 are removed.

Also, a curved region of a differential transmission line shown in FIG. 24B having the same reference labels as shown in FIG. 24A can be realized based on the disclosure of Non-Patent Document 3. In this case, two signal conductors 102a and 102b are disposed in parallel, while being smoothly bent in a curved region around an assumed center of curvature.

With the constructions of Patent Document 1 and Non-Patent Document 1, no effects of suppressing the unwanted mode conversion from a differential signal (i.e., odd mode) to an in-phase signal (i.e., even mode) in a curved region can be obtained. In a curved region of a differential transmission line, a more severe unwanted mode conversion occurs with an increased transmission frequency. Therefore, good transmission in the differential mode cannot be realized by merely providing slots in the ground conductor layer.

Moreover, unwanted mode conversion cannot be sufficiently suppressed by applying the structures of Non-Patent Documents 2 and 3, which are proposed for improving the high-frequency characteristics in single-ended signal transmission, to a curved region of a differential transmission line.

SUMMARY OF THE INVENTION

The present invention has been made in order to solve the above problems, and a main objective thereof is to provide a differential transmission line in which unwanted mode conversion at curved regions is suppressed.

A differential transmission line according to the present invention is a differential transmission line comprising: a substrate; a ground conductor layer formed on a rear side of the substrate; and a first signal conductor and a second signal conductor disposed in parallel to each other on a front side of the substrate, the first signal conductor and the ground conductor layer composing a first transmission line, and the second signal conductor and the ground conductor layer composing a second transmission line, wherein, the differential transmission line includes two straight regions in which the first and second transmission lines extend linearly and a curved region interconnecting the two straight regions; the first signal conductor is disposed in a position relatively close to a center of curvature of the curved region, and the second signal conductor is disposed in a position relatively far from the center of curvature; in the curved region, a plurality of slots which are orthogonal to a local signal transmission direction are provided in the ground conductor layer; and the plurality of slots intersect the first signal conductor, the plurality of slots being connected to one another on an inner side of curvature of the curved region.

In a preferred embodiment, at least one second slot is provided in the ground conductor layer, the at least one second slot being connected to one of the plurality of slots on an inner side of curvature of the curved region.

In a preferred embodiment, the second slot extends in a direction away from the first signal conductor with respect to the center of curvature.

In a preferred embodiment, the second slot does not intersect signal transmission directions in the straight regions.

In a preferred embodiment, a plurality of second slots are comprised.

In a preferred embodiment, a line width Wb1 of the first signal conductor in at least a portion of the curved region is smaller than a line width Ws1 of the first signal conductor in the straight regions; a line width Wb2 of the second signal conductor in at least a portion of the curved region is smaller than a line width Ws2 of the second signal conductor in the straight regions; a gap width Gb between the first signal conductor and the second signal conductor in at least a portion of the curved region is equal to or less than a gap width Gs between the first signal conductor and the second signal conductor in the straight regions; and a minimum value Rb1 of radius of curvature of a line edge of the curved region of the first signal conductor that is closer to the center of curvature is greater than a perpendicular distance Rs1 from the center of curvature to an extension of a line edge of each straight region of the first signal conductor that is closer to the center of curvature.

In a preferred embodiment, a radius of curvature Rb2 of a line edge of the curved region of the second signal conductor that is away from the center of curvature is equal to a perpendicular distance Rs2 from the center of curvature to an extension of a line edge of each straight region of the second signal conductor that is away from the center of curvature.

A differential transmission line according to the present invention is a differential transmission line comprising: a substrate; a ground conductor layer formed on a rear side of the substrate; and a first signal conductor and a second signal conductor disposed in parallel to each other on a front side of the substrate, the first signal conductor and the ground conductor layer composing a first transmission line, and the second signal conductor and the ground conductor layer composing a second transmission line, wherein, the differential transmission line includes two straight regions in which the first and second transmission lines extend linearly and a curved region interconnecting the two straight regions; the first signal conductor is disposed in a position relatively close to a center of curvature of the curved region, and the second signal conductor is disposed in a position relatively far from the center of curvature; in the curved region, at least one first slot which is orthogonal to a local signal transmission direction and intersects the first signal conductor is provided in the ground conductor layer; and at least one second slot which is connected to the first slot on an inner side of curvature of the curved region is provided in the ground conductor layer, the second slot extending in a direction away from the first signal conductor with respect to the center of curvature.

In a preferred embodiment, a plurality of second slots are provided in the ground conductor layer.

In a preferred embodiment, a plurality of first slots are provided in the ground conductor layer.

In accordance with a differential transmission line of the present invention, an unwanted mode conversion which would occur in a curved region of a conventional differential transmission line can be suppressed, thus making it possible to reduce the amount of unwanted radiation. Since it is not necessary to employ a filter for removing the in-phase mode, which would be introduced in a conventional differential transmission line for removal of the unwanted in-phase mode, there are provided effects such as: cost reduction, reduction of occupied area in the circuitry, improvement in the intensity of the differential mode passing signal which may have been deteriorated by the insertion of an in-phase mode filter.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 7A is an upper see-through view of a differential transmission line according to Embodiment 2 of the present invention. FIG. 7B is an upper see-through view of a differential transmission line according to Embodiment 1 of the present invention.

FIG. 8 is a cross-sectional view of a differential transmission line according to Embodiment 2.

FIG. 21A is an upper plan view of a conventional differential transmission line. FIG. 21B is a view showing a cross-sectional structure of the conventional differential transmission line, together with electric-field vectors under the differential mode. FIG. 21C is a view showing a cross-sectional structure of the conventional differential transmission line, together with electric-field vectors under the in-phase mode.

DETAILED DESCRIPTION OF PREFERRED EMBODIMENTS

Figure 1:
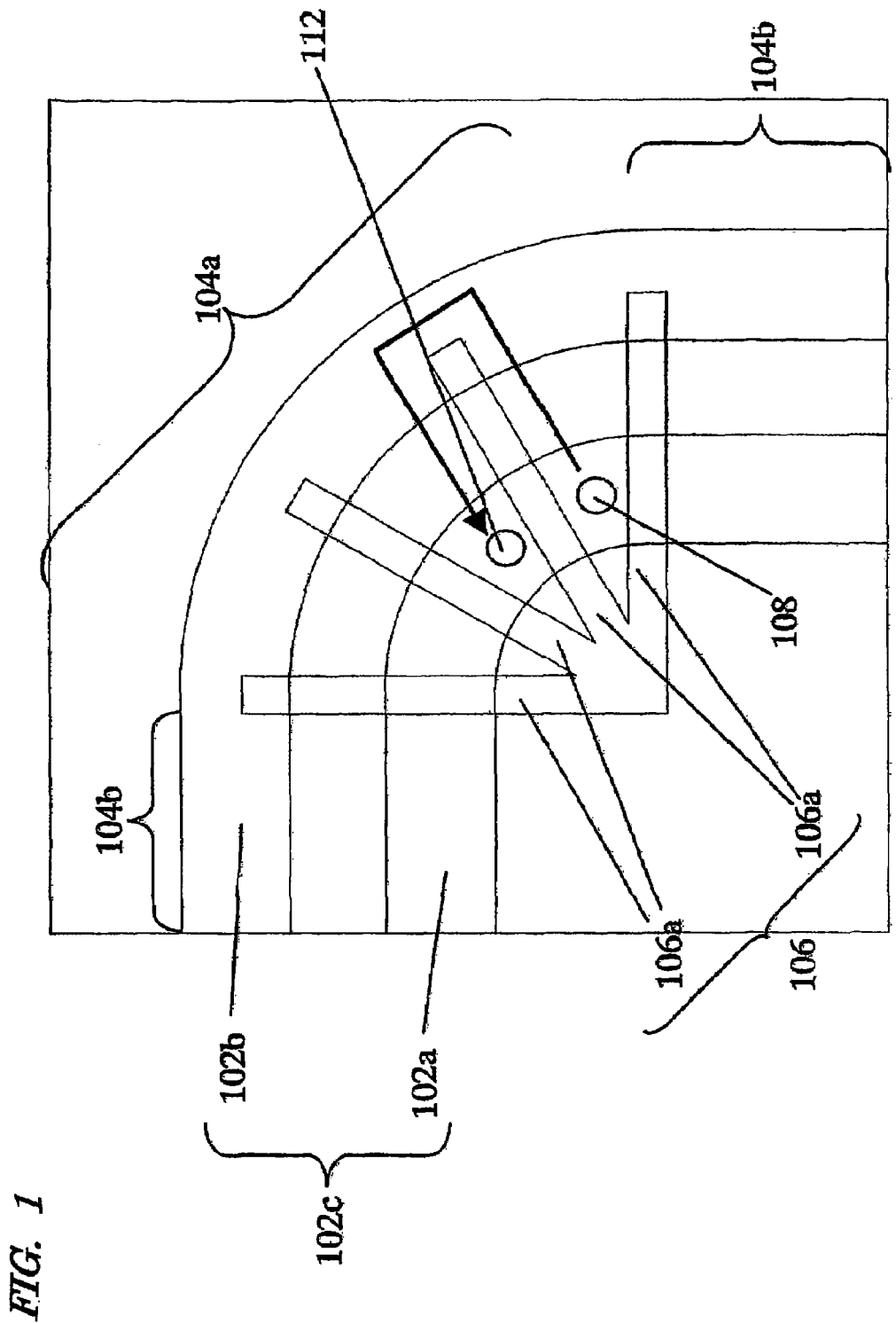
FIG. 1 is an upper see-through view of a differential transmission line according to Embodiment 1.

Hereinafter, preferred embodiments of the present invention will be described with reference to the accompanying drawings. It is noted that in the following embodiments, the same or substantially similar parts, elements or features appearing more than one view of the drawings are labeled with the same reference numerals or labels.

Embodiment 1

Figure 2:
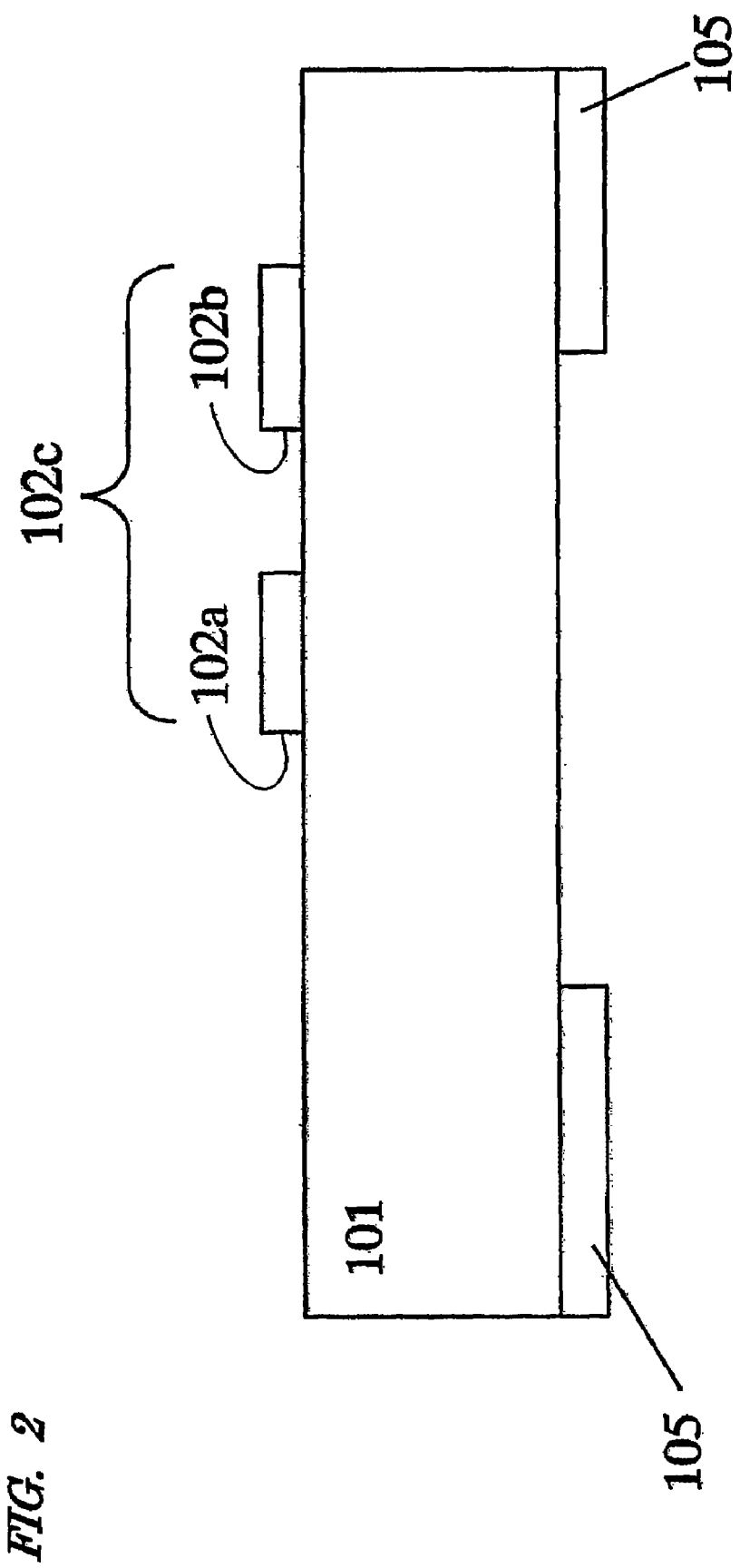
FIG. 2 is a cross-sectional view of the differential transmission line according to Embodiment 1.
Figure 3:
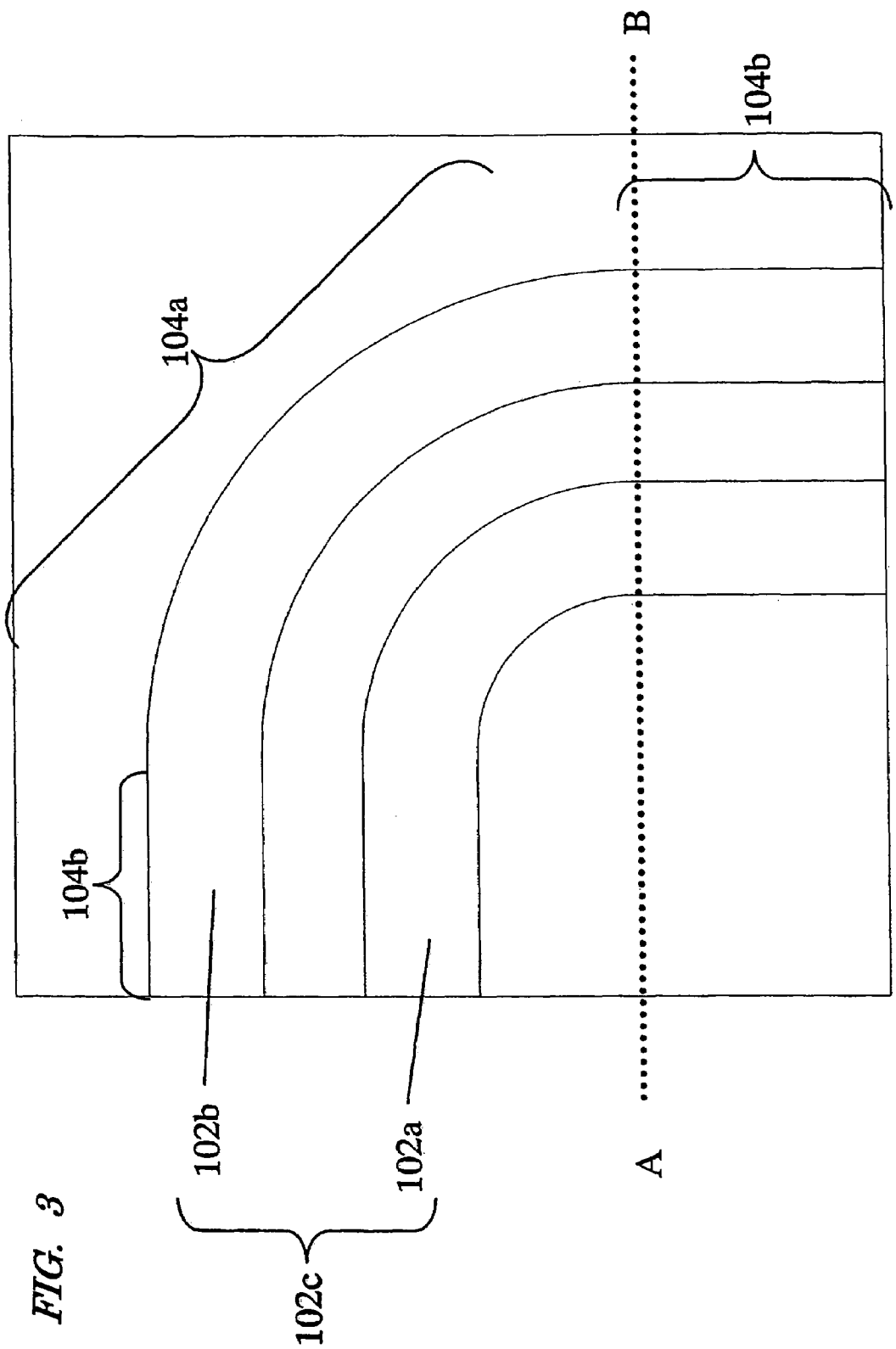
FIG. 3 is an upper plan view of the differential transmission line according to Embodiment 1.
Figure 4:
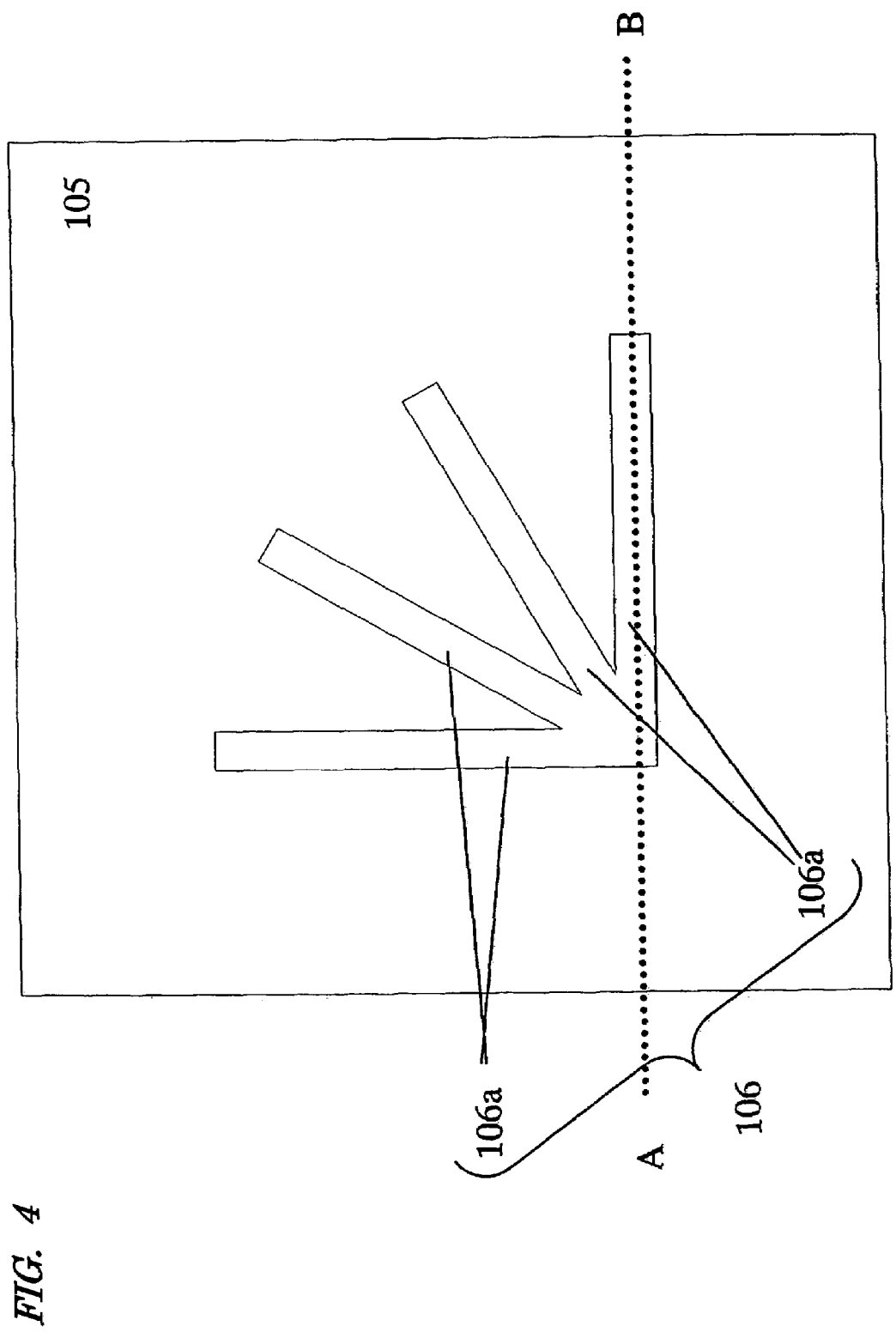
FIG. 4 is an upper see-through view of a lowermost face of a circuit board 101 of the differential transmission line according to Embodiment 1.
Figure 5:
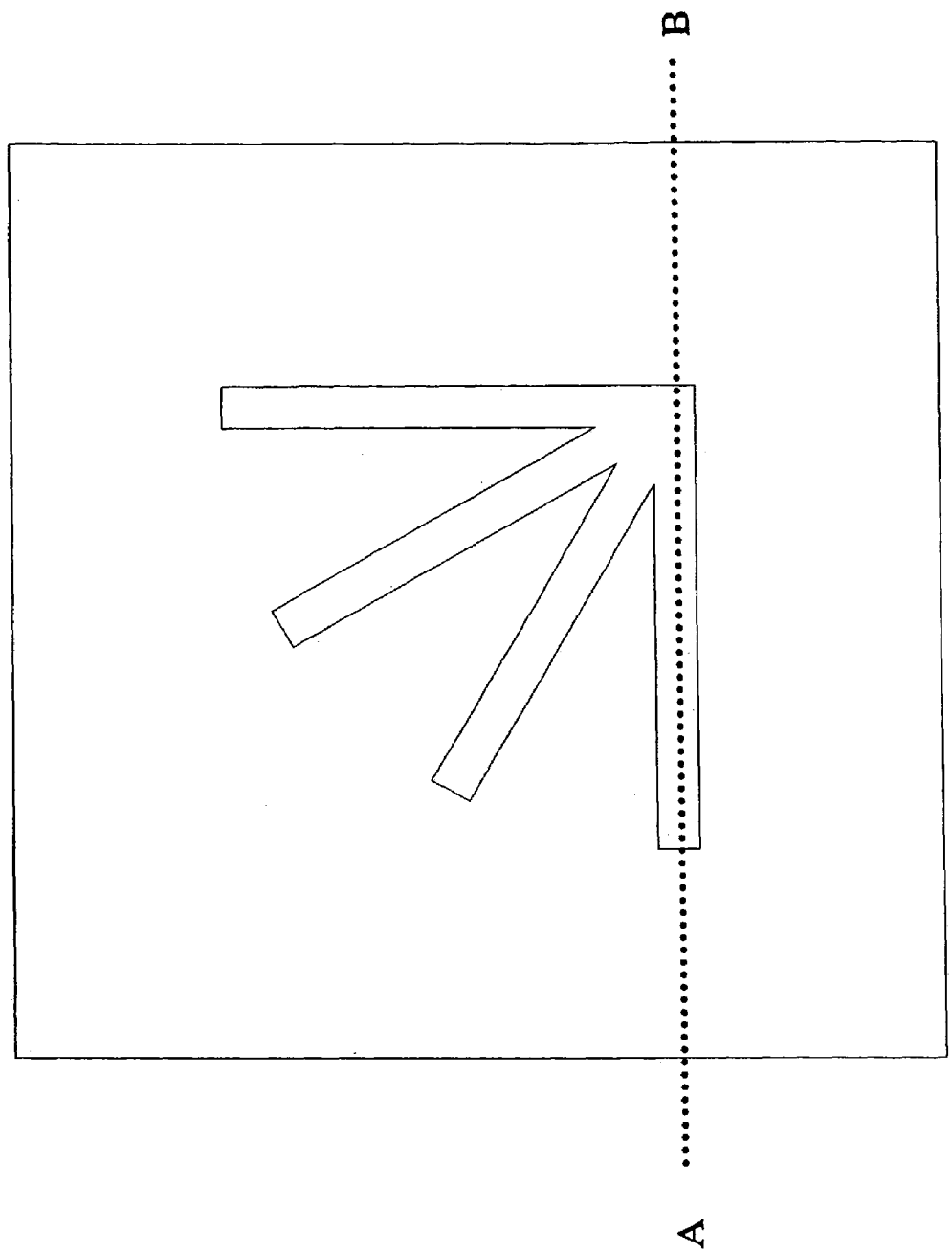
FIG. 5 is a bottom view as seen from a lower face (in a strict sense) of Embodiment 1 (a mirror-symmetric view of FIG. 4).

First, with reference to FIGS. 1 to 5, a differential transmission line according to Embodiment 1 of the present invention will be described. FIG. 1 is an upper see-through view of the differential transmission line of the present embodiment. FIG. 2 is a cross-sectional view of the differential transmission line of the present embodiment. FIG. 3 is an upper plan view of the differential transmission line of the present embodiment. FIG. 4 is a view in which the lowermost face of a circuit board 101 is seen through the upper face. FIG. 5 (mirror-symmetric with respect to FIG. 4) is a bottom view showing a ground conductor layer 105 as seen from the lower face side. Note that the cross-sectional view of FIG. 2 shows a cross section of the circuit board 101 along a plane containing line A-B in FIGS. 3 and 4.

The differential transmission line of the present embodiment includes a circuit board 101 (see FIG. 2), a ground conductor layer 105 (see FIGS. 2 and 4) which is formed on the rear side of the circuit board 101, and as shown in FIGS. 1-3, a first signal conductor 102a and a second signal conductor 102b provided in parallel to each other on the front side of the circuit board 101. The circuit board 101 in the present embodiment is formed of a dielectric, although it may also be formed of a semiconductor.

Note that, in the present specification, "the rear side of a substrate" does not only mean a rear face of the substrate itself; in the case where any other layer is formed on the rear face of the substrate, the "rear side of the substrate" is also meant to include the surface of any such layer. The ground conductor layer 105 may be covered with another layer. Similarly, "the front side of a substrate" does not only mean a front face of the substrate itself; in the case where any other layer is formed on the front face of the substrate, the "front side of the substrate" is also meant to include the surface of any such layer. The first signal conductor 102a and the second signal conductor 102b and the ground conductor layer 105 may be covered with other layers.

The first signal conductor 102a and the ground conductor layer 105 compose a first transmission line, whereas the second signal conductor 102b and the ground conductor layer 105 compose a second transmission line. The transmission line pair, i.e., the first and second transmission lines, composes a differential transmission line 102c (see FIGS. 1-3).

The differential transmission line 102c includes a curved region 104a, with a straight region 104b being connected to each end of the curved region 104a as shown in FIGS. 1 and 3. In the curved region 104a, the two signal conductors 102a and 102b form parallel curves.

In the present embodiment, a plurality of slots 106a are formed in the ground conductor layer 105 in the curved region 104a. Each slot 106a extends in an elongated shape, along a direction orthogonal to a local transmission direction of signals within the curved region 104a. In the illustrated example, four slots 106a are connected to one another, at one end thereof, on the inner side of the curvature, thus forming a slot complex 106 as shown in FIGS. 1 and 4. However, in order to obtain the effects of the present invention, it is only necessary that at least two of the plurality of slots 106a are connected to one another on the inner side of curvature of the curved region 104a.

The slot complex 106 is a high frequency circuit element which is obtained by removing a portion of the ground conductor layer 105. Such a slot complex 106 can be easily formed as follows, for example. That is, after the ground conductor layer 105 is deposited over the entire rear face of the circuit board 101, the surface of the ground conductor layer 105 is covered with a mask having an aperture defining the pattern of the slots 106a (e.g., a resist mask). Next, the portion of the ground conductor layer 105 which is exposed through the aperture of the mask is removed by wet etching technique, whereby the slots 106 of a desired shape can be formed at an arbitrary position on the ground conductor layer 105. Note that, a lift-off technique may be applied when forming the ground conductor layer 105 to form a ground conductor layer 105 which has an aperture pattern corresponding to the slot complex 106.

In the present specification, a "slot" is what is obtained when a portion of the ground conductor layer 105 is removed completely across its thickness direction. In other words, any trench which is formed by only partially removing a surface layer of the ground conductor layer 105 does not qualify as a "slot".

The signal conductors 102a and 102b formed on the front side of the circuit board 101 can be formed by, for example, depositing a conductor layer over the entire front face of the circuit board 101, and then selectively removing portions of the conductor layer.

Figure 6:
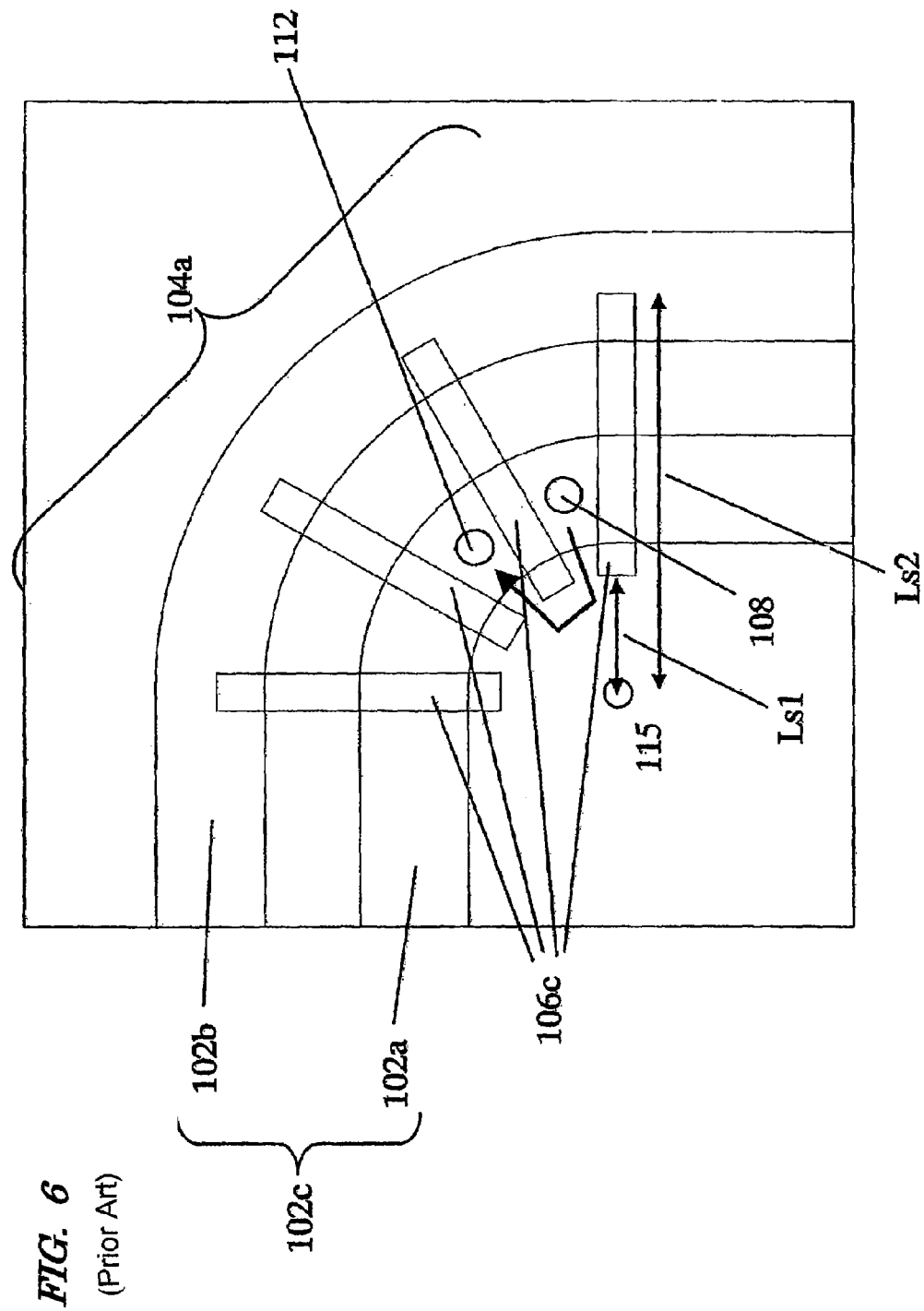
FIG. 6 is an upper see-through view of an example of a conventional differential transmission line in which the technique of Patent Document 1 is utilized.

For comparison, a structure in which slots 106c as disclosed in Patent Document 1 are formed in a curved region 104a of a differential transmission line 102c is shown in FIG. 6. In the curved region 104a shown in FIG. 6, the plurality of slots 106c are formed so as to be each orthogonal to a local signal transmission direction in the differential transmission line 102c, but the slots 106c are separated from one another (i.e., not connected) by a conductor portion in the ground conductor layer 105.

As will be clear from comparison between FIG. 6 and FIG. 1, the slots 106a according to the present embodiment differ significantly from the slots 106c in FIG. 6, in that the slots 106a are connected to one another on the inner side of curvature of the curved region 104a so as to form the slot complex 106.

In the curved region 104a, the first transmission line which is located inside has a shorter length than that of the second transmission line which is located outside. Therefore, there is a difference in electrical length based on a difference between the path lengths of high frequency currents. In order to suppress unwanted mode conversion from the differential mode to the in-phase mode, it is preferable to ensure circuit symmetry between the two lines composing the differential transmission line, which makes it necessary to compensate for the difference in electrical length in the curved region 104a.

The plurality of slots 106c shown in FIG. 6 do not function to compensate for the difference in electrical length between the transmission lines in the curved region 104a. On the other hand, the slot complex 106 of the present embodiment enables compensation for the aforementioned difference in electrical length. Hereinafter, it will be described how the difference in electrical length in the curved region 104a can be compensated for according to the present embodiment.

In either the construction of FIG. 1 and the construction of FIG. 6, the ground conductor layer 105 lying immediately under a point 108 on the first signal conductor 102a in the curved region 104a functions as a ground conductor for high-frequency transmission. Similarly, the ground conductor layer 105 lying immediately under another point 112 on the first signal conductor 102a functions as a ground conductor for high-frequency transmission.

However, in the construction of FIG. 1, when a signal moves on the first signal conductor 102a from the point 108 to the point 112, the path of the high frequency current within the ground conductor layer 105, corresponding to this signal transmission, is interrupted between the point 108 and the point 112 by the slot complex 106. Therefore, the high frequency current within the ground conductor layer 105 corresponding to the signal transmission will have to detour around the edge of the slot complex 106, as shown by an arrow in FIG. 1. Since the slot complex 106 interrupts the current paths in the ground conductor on the inner side of curvature, the detouring effect on each high frequency current path in the ground conductor layer 105 is stronger in the first transmission line than in the second transmission line. As a result, in the first transmission line having a relatively short electrical length, the electrical length in the ground conductor layer 105 becomes relatively extended. Accordingly, the difference in electrical length between the signal conductors 102a and 102b is compensated for.

On the other hand, in the structure of FIG. 6, when a signal moves on the first signal conductor 102a from the point 108 to the point 112, the high frequency current on the ground conductor 102 is prohibited from making a linear movement from the point 108 to the point 112, but is not prohibited from following a shortcut around the center of curvature. Thus, as shown in an arrow in FIG. 6, there is a path with a short electrical length around the center of curvature of the curved region 104a. Unless this path is prohibited, the first transmission line cannot realize a detour structure in the moving path of a high frequency current in the ground conductor layer 105, thus making it impossible to compensate for the difference in electrical length between the signal conductors 102a and 102b.

In order to attain the objective of the present invention, it is necessary to not only form a plurality of slots 106a but also to connect at least two of the slots 106a to one another on the inner side of curvature of the curved region 104a.

Note that, although FIG. 1 illustrates an example where the slots 106a composing the slot complex 106 only extend to a middle point along the width direction of the second signal conductor 102b, the slots 106a may alternatively be formed so as to lie across the second signal conductor 102b. With such a longer slot length, a detouring effect on the current path in the ground conductor layer 105 will also occur in the second transmission line. However, this does not detract from the compensating effect for the difference in electrical length between the two transmission lines because the electrical length of the detouring current path in the ground conductor layer 105 of the first transmission line will also increase in accordance with the detouring electrical length. In other words, each slot 106a may have no intersection with the second signal conductor 102b at all, or may be long enough to traverse all the way across the second signal conductor 102b.

Note that the resonant frequency of the slot complex 106 must be prescribed to a value which is higher than the transmission frequency.

As described above, according to the present embodiment, in a curved region of a differential transmission line, a difference in electrical length between the two lines composing the differential transmission line is reduced, whereby unwanted mode conversion is suppressed.

Embodiment 2

Next, a differential transmission line according to Embodiment 2 of the present invention will be described.

First, FIGS. 7A and 7B will be referred to. FIG. 7A is an upper see-through view of the differential transmission line of the present embodiment. For comparison, FIG. 7B shows an upper see-through view of the differential transmission line of Embodiment 1.

In the present embodiment, as in the above-described embodiment as shown in FIG. 8, a ground conductor layer 105 is formed on the rear side of a circuit board 101, and a first signal conductor 102a and a second signal conductor 102b are provided in parallel to each other on the front side of the circuit board 101. The first signal conductor 102a and the ground conductor layer 105 compose a first transmission line, whereas the second signal conductor 102b and the ground conductor layer 105 compose a second transmission line. The transmission line pair, i.e., the first and second transmission line, composes a differential transmission line 102c.

Figure 9:
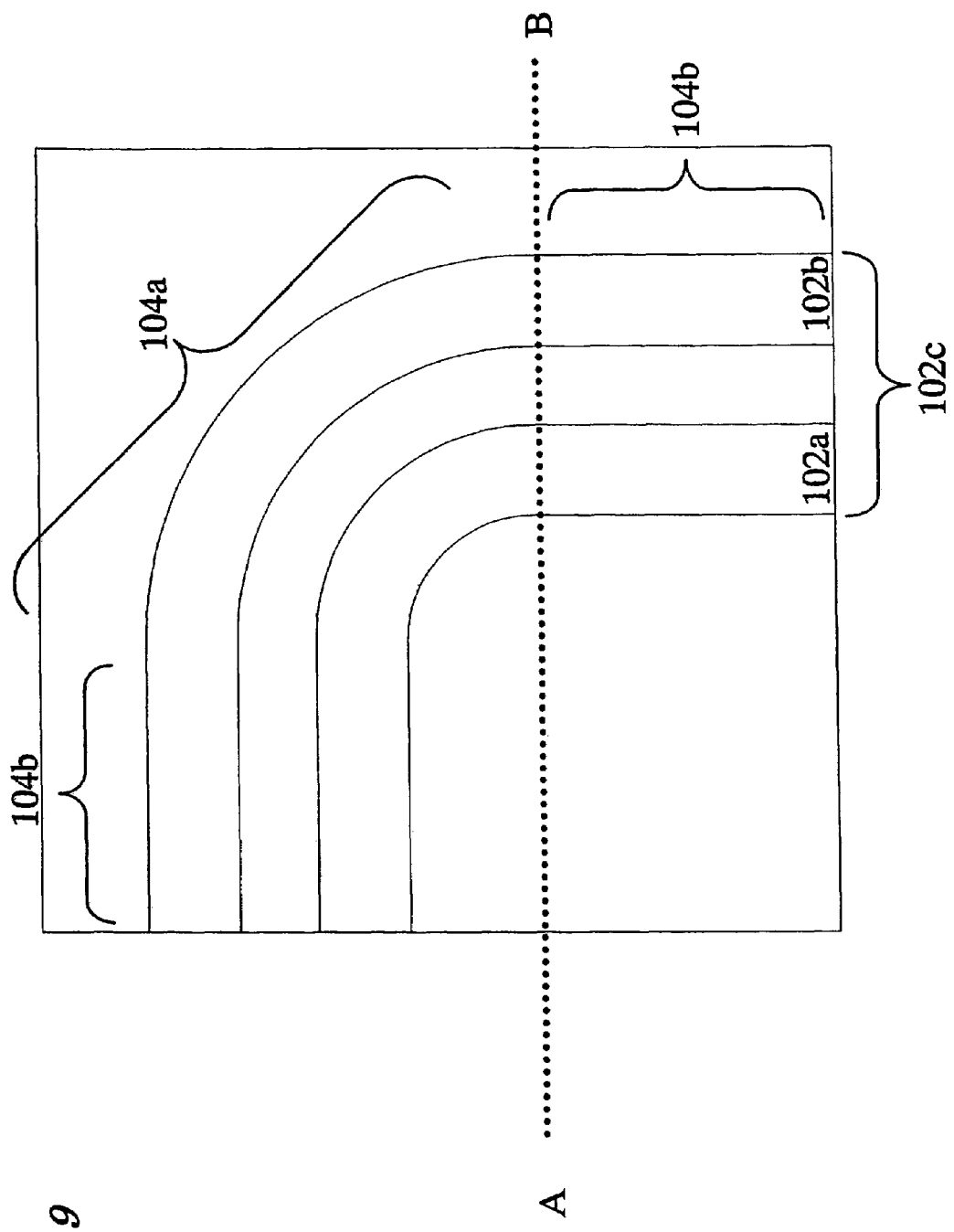
FIG. 9 is an upper plan view of the differential transmission line according to Embodiment 2.
Figure 10:
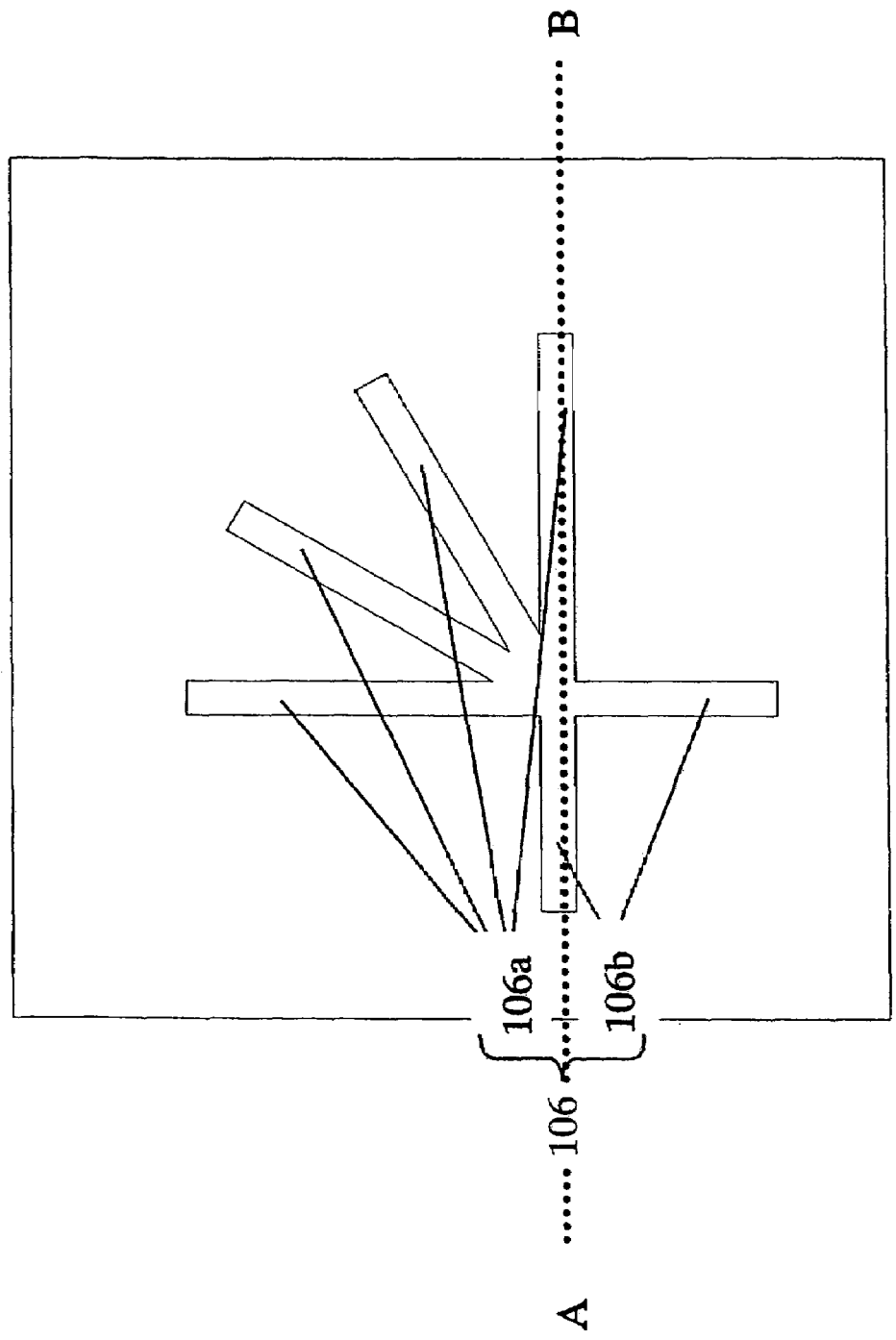
FIG. 10 is an upper see-through view of a lowermost face of a circuit board 101 of the differential transmission line according to Embodiment 2.
Figure 11:
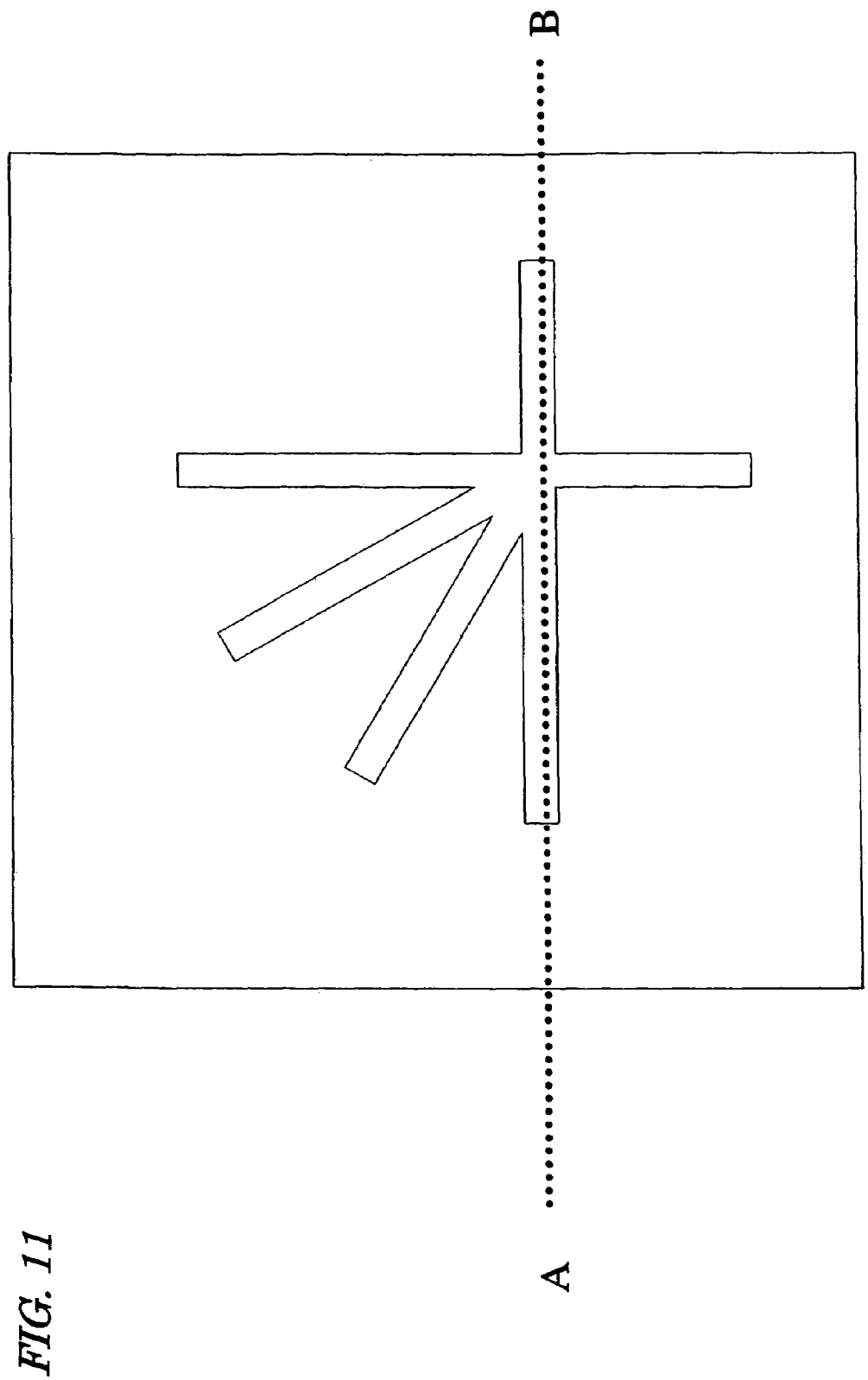
FIG. 11 is a bottom view as seen from a lower face (in a strict sense) of Embodiment 2 (a mirror-symmetric view of FIG. 10).

FIG. 8 is a cross-sectional view of the differential transmission line 102c of the present embodiment. FIG. 9 is an upper plan view of the differential transmission line of the present embodiment. FIG. 10 is a view in which the lowermost face of the circuit board 101 is seen through the upper face. On the other hand, FIG. 11 (mirror-symmetric with respect to FIG. 10) is a bottom view showing a ground conductor layer 105 as seen from the lower face side. Note that the cross-sectional view of FIG. 8 shows a cross section of the circuit board 101 along a plane containing line A-B in FIGS. 9 and 10.

The differential transmission line 102c of the present embodiment also includes a curved region 104a, with a straight region 104b being connected to each end of the curved region 104a as shown in FIGS. 7A, 7B and 9. As shown in FIGS. 7A, 7B and 10, first slots 106a are formed in the curved region 104a of the ground conductor layer 105. Each first slot 106a extends in an elongated shape, along a direction orthogonal to a local transmission direction of signals within the curved region 104a.

In the present embodiment as shown in FIG. 7A, two second slots 106b are formed in the ground conductor layer 105 near the straight regions 104b. Each second slot 106b is provided from the center of curvature of the curved region 104a, preferably in a position not intersecting with the first signal conductor 102a. Although each second slot 106b of the present embodiment is shown to extend generally in parallel to the signal transmission direction in the adjacent straight region 104b, the second slot 106b does not need to be parallel to the signal transmission direction, but may be oblique thereto. Preferably, however, each second slot 106b extends in a direction which is not orthogonal to the signal transmission direction in the adjacent straight region 104b. Note that the second slots 106b are capable of exhibiting the effects described below so long as they extend in a direction away from the first signal line 102a with respect to the center of curvature of the curved region 104a. At least one such second slot 106b may be provided; there do not need to be two second slots 106b.

The first slots 106a and the second slots 106b are connected on the inner side of curvature of the curved region 104a, thus forming a slot complex 106 as shown in FIGS. 7A and 10. The slot complex 106 of the present embodiment functions to cause selective detouring of a high frequency current path in the ground conductor layer 105 of the first transmission line. Therefore, an extra electrical length can be added to the moving path of a high frequency current in the ground conductor layer 105 of the first transmission line, whose signal conductor 102 has a shorter electrical length than that of the second transmission line. As a result, the difference in electrical length associated with the positioning of the signal conductors 102 can be compensated for (reduced) by this extra electrical length.

The slot complex 106 is obtained by removing the conductor, completely across its thickness direction, in a region of the ground conductor layer 105. The slot complex 106 can be easily produced by a method similar to the method described with respect to Embodiment 1.

As indicated by an arrow in FIG. 7B, it is possible in Embodiment 1 that, beginning in either straight region 104b, the high frequency current through the first transmission line may gradually deviate from the path of traveling immediately under the first signal conductor 102a, and instead follow a path which smoothly curves through the neighborhood 113 of the center of the curvature of the curved region 104a. Such a path will not provide a sufficient signal delaying effect in the ground conductor layer 105 with respect to the first transmission line. On the other hand, according to the present embodiment, the second slots 106b which are connected to the first slots 106a are introduced as shown in FIG. 7A, whereby the aforementioned signal delaying effect can be sufficiently exhibited.

If the second slots 106b were formed in the ground conductor layer 105 so as to be orthogonal to the signal transmission direction, some influence would be exerted on the signal transmission characteristics. However, the second slots 106b are not intended for unfavorably affecting the good differential mode characteristics of the straight regions 104b.

Figure 12A:
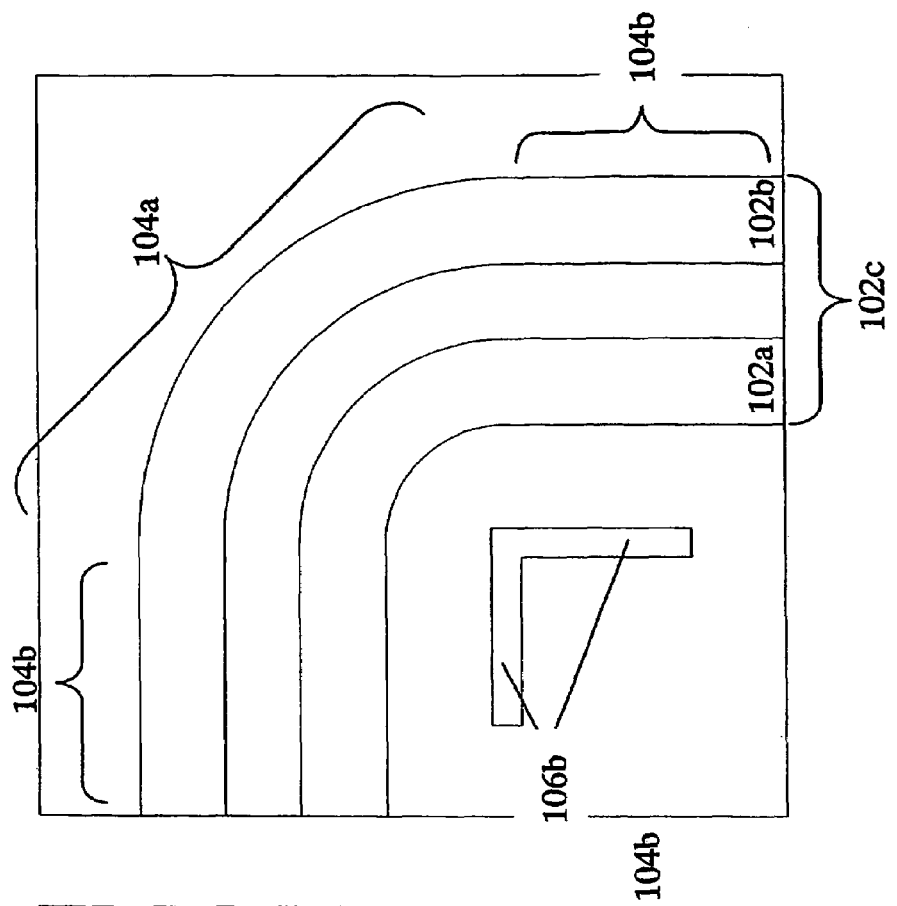
FIGS. 12A and 12B are upper see-through views of differential transmission lines which are different from the differential transmission line according to Embodiment 2 of the present invention.
Figure 12B:
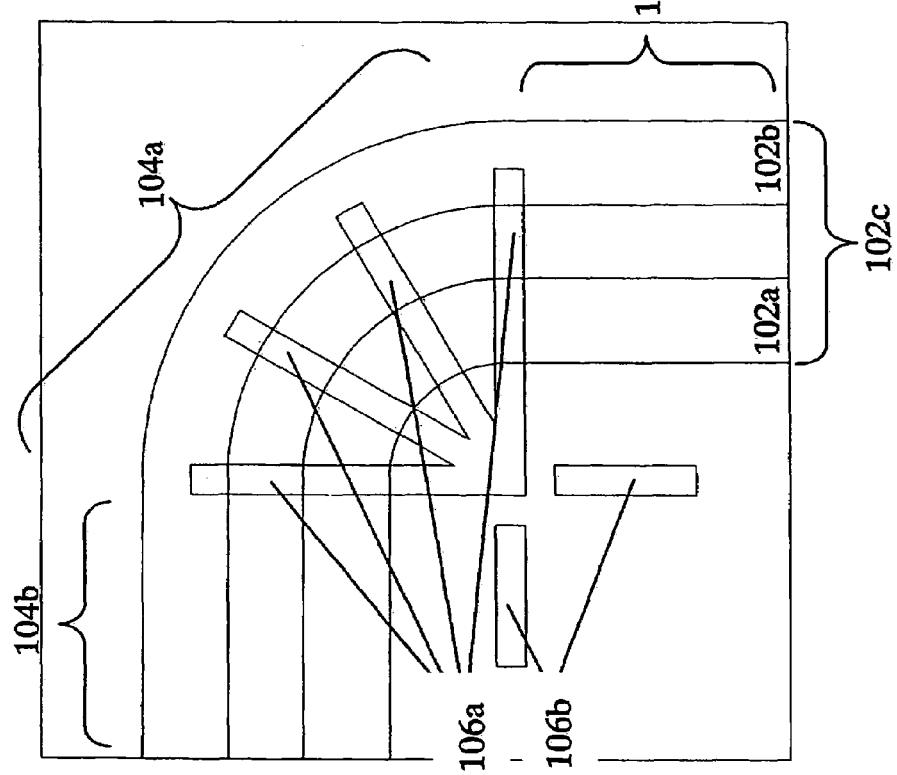

The second slots 106b are introduced for the purpose of restricting a high frequency current flowing through the ground conductor layer 105 in the curved region 104a so that it cannot follow the shortest path (i.e., the path shown in FIG. 7B). Therefore, the second slots 106b need to be connected to the first slots 106a. Thus, if the first slots 106a and the second slots 106b were not connected as shown in FIG. 12A, the expected effects of the second slots 106b would not be obtained. On the other hand, as shown in FIG. 12B, if only the second slots 106b were formed without any first slots 106a being formed, no detouring would occur in the path of the high frequency current flowing through the ground conductor layer of the first transmission line, since the first slots 106a do not exist; thus, the effects of characteristic improvement would not be obtained.

Although FIG. 7A illustrates an example where a plurality of first slots 106a are formed, the first slots 106a do not have to be plural in number, but there may only be a single first slot 106a in the present embodiment. In Embodiment 1, a single first slot 106a would not be able to realize detouring of a high frequency current in the ground conductor layer 105. In the present embodiment, however, detouring of a high frequency current in the ground conductor layer 105 can be realized with only a first slot 106a, so long as the first slot 106a is connected to a second slot 106b.

However still, as shown in FIG. 7A, it is preferable that a second slot 106b is formed near each of the two straight regions 104b connected to the curved region 104a and that each second slot 106b is connected to at least one first slot 106a. By forming the second slots 106b near the respective straight regions 104b, unwanted mode conversion to the in-phase mode can be suppressed more effectively. In the case where the second slots 106b are formed near both straight regions 104b, the two slots 106b do not need to be of an identical shape. Note that the slot complex 106 is prescribed in a size for not exhibiting a resonance phenomenon at the transmission signal frequency.

According to the present embodiment, in a curved region of a differential transmission line, a difference in electrical length between the two transmission lines composing the differential transmission line is substantially reduced, whereby unwanted mode conversion to the in-phase mode is suppressed.

Embodiment 3

Next, a differential transmission line according to Embodiment 3 of the present invention will be described.

Figure 13:
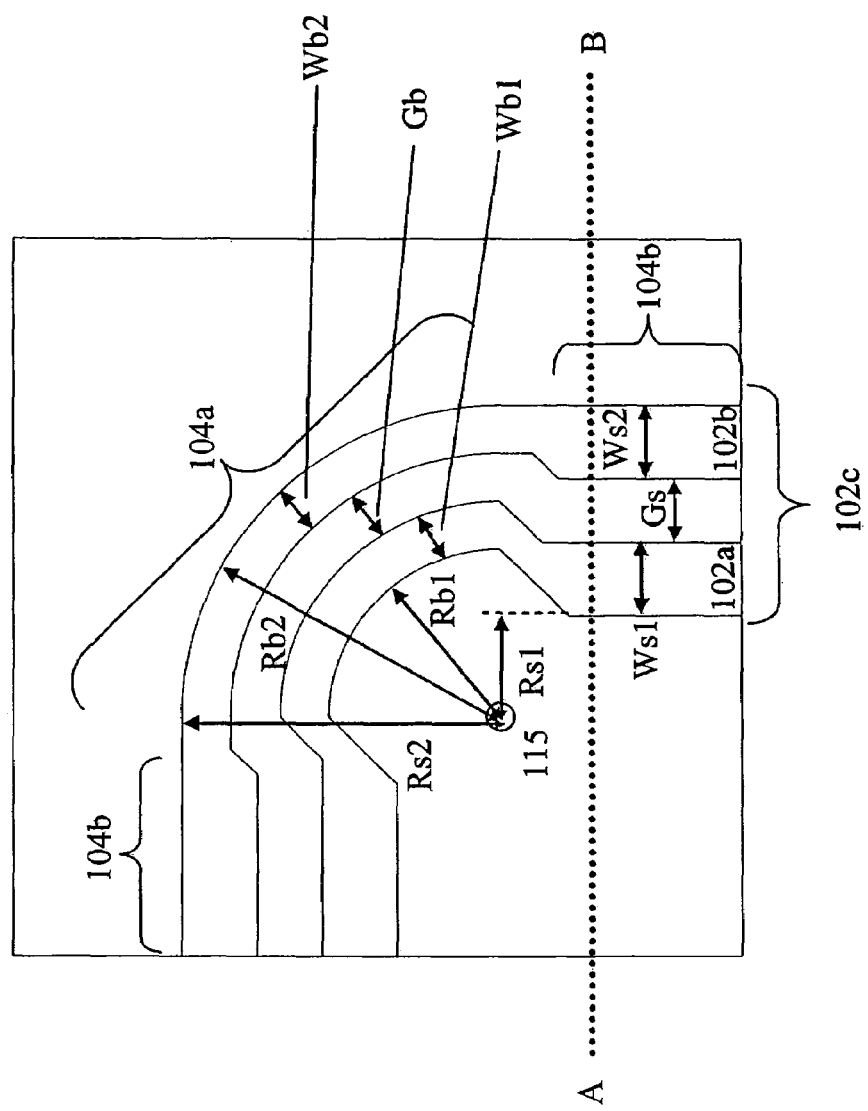
FIG. 13 is an upper plan view of a differential transmission line according to Embodiment 3.
Figure 14:
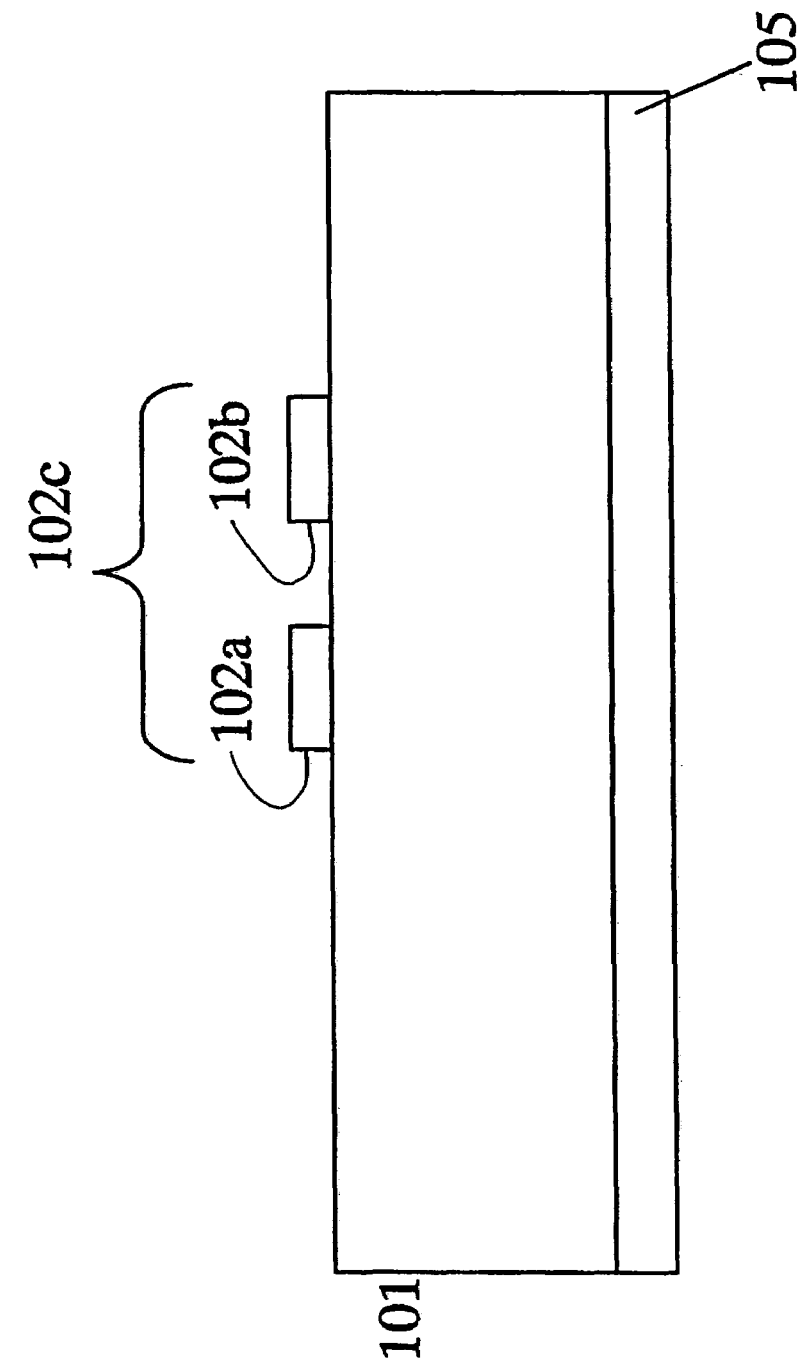
FIG. 14 is a circuit cross-sectional view taken along a dotted line AB in FIG. 13.
Figure 15:
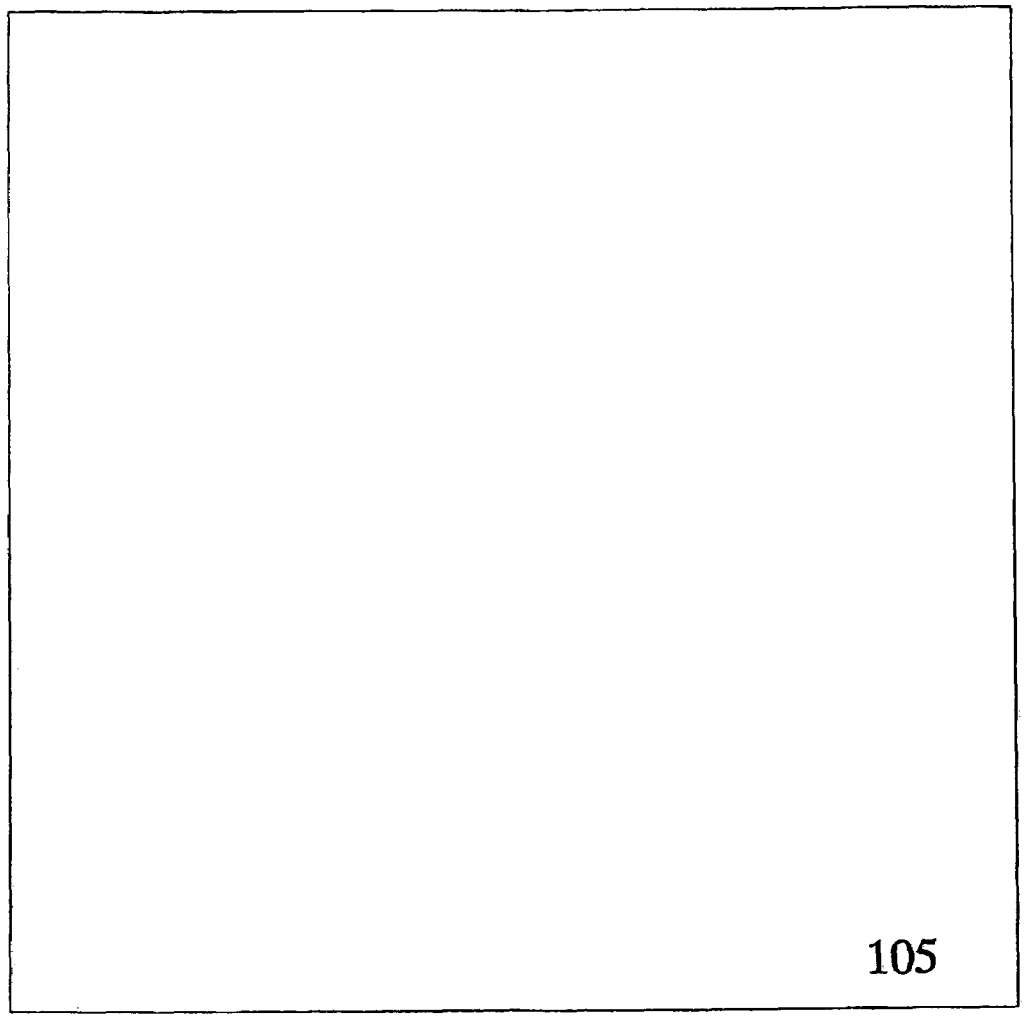
FIG. 15 is a bottom view of the differential transmission line according to Embodiment 3.

First, FIGS. 13 to 15 will be referred to. FIG. 13 is an upper plan view of the differential transmission line of the present embodiment. FIG. 14 is a cross-sectional view showing a cross section of the present embodiment taken along dotted line AB in FIG. 13. FIG. 15 is a bottom view of the present embodiment.

In the present embodiment as shown in FIG. 14, as in the above-described embodiment, a ground conductor layer 105 is formed on the rear side of a circuit board 101, and a first signal conductor 102a and a second signal conductor 102b are provided in parallel to each other on the front side of the circuit board 101. The first signal conductor 102a and the ground conductor layer 105 compose a first transmission line, whereas the second signal conductor 102b and the ground conductor layer 105 compose a second transmission line. The transmission line pair, i.e., the first and second transmission lines, composes a differential transmission line 102c.

The differential transmission line 102c includes a curved region 104a, with a straight region 104b being connected to each end of the curved region 104a. As shown in FIG. 15, the rear face of the circuit board 101 of the present embodiment is entirely covered by the ground conductor layer 105.

In the present specification as shown in, for example, FIGS. 7A, 7B, 13, 16A, 16B, 17, the line width of the first signal conductor 102a in the curved region 104a is denoted as Wb1; the line width of the second signal conductor 102b in the curved region 104a is denoted as Wb2; the gap width between the first signal conductor 102a and the second signal conductor 102b in the curved region 104a is denoted as Gb; the line width of the first signal conductor 102a in the straight region 104b is denoted as Ws1; the line width of the second signal conductor 102b in the straight region 104b is denoted as Ws2; the gap width between the first signal conductor 102a and the second signal conductor 102b in the straight region 104b is denoted as Gs; the shortest distance from the center of curvature 115 of the curved region to a line edge of the curved region of the first signal conductor 102a that is closer to the center of curvature is denoted as Rb1; the perpendicular distance from the center of curvature 115 of the curved region to an extension of a line edge of the straight region of the first signal conductor 102a that is closer to the center of curvature is denoted as Rs1; the shortest distance from the center of curvature 115 of the curved region to a line edge of the curved region of the second signal conductor 102b that is closer to the outer periphery of curvature is denoted as Rb2; and the perpendicular distance from the center of curvature 115 of the curved region to an extension of a line edge of the straight region of the second signal conductor 102b that is closer to the outer periphery of curvature is denoted as Rs2.

In the present embodiment, Wb1 is prescribed to be narrower than Ws1; Wb2 is prescribed to be narrower than Ws2; Gb is prescribed to be narrower than Gs; and Rb1 is prescribed to be greater than Rs1.

At the connection between the curved region 104a and each straight region 104b, the line width of each signal conductor 102 and the gap width therebetween do not need to be uniformly prescribed at constant values. It is to be understood that Embodiment 3 encompasses any construction where the aforementioned conditions are prescribed in a region including a central portion of the curved region 104a.

Figure 23:
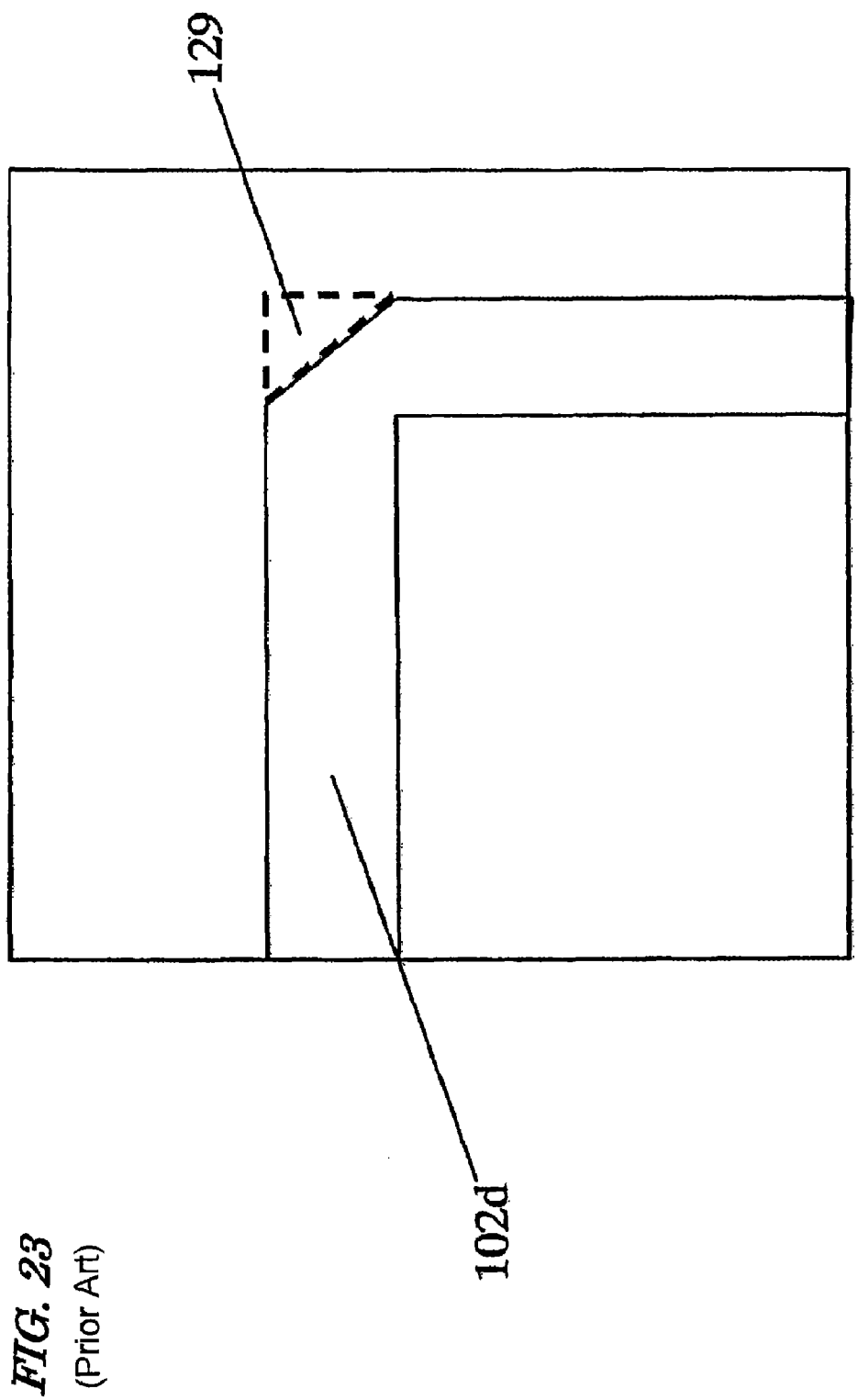
FIG. 23 is a schematic upper plan view of a single-ended transmission line disclosed in Non-Patent Document 2.

As disclosed in Non-Patent Document 2, a ground capacitance which is created in a curved region of a single-ended line deteriorates the transmission characteristics, and therefore, as shown in FIG. 23, it is effective to cut off a portion 129 of the curved region of the signal conductor 102d so as to reduce the area of the curved region. In single-ended signal transmission, an increase in ground capacitance affects the circuit characteristics only in the form of a temporary decrease in characteristic impedance, and therefore it is possible to obtain a sufficient characteristic improvement by using the construction shown in FIG. 23. However, in differential signal transmission, an increase in ground capacitance of a curved region would have a critically unfavorable influence. The reason is that, as shown in FIG. 21B, under the differential mode of a differential transmission line, i.e., a transmission mode where an electric field concentrates between the two signal conductors 102a and 102b, an increase in ground capacitance would induce an in-phase mode in which electric-field vectors separately head toward the ground conductor layer 105 from each signal conductor 102a and 102b.

In the present embodiment, the ground capacitance in the curved region 104a is reduced by decreasing the line widths of the first and second signal conductors 102a and 102b. However, by merely decreasing the line widths of the first signal conductor 102a and the second signal conductor 102b, the transmission characteristics may possibly deteriorate, rather than being improved. For example, in Comparative Example shown in FIG. 16A, Wb1 and Wb2 are designed so as to be smaller than Ws1 and Ws2, respectively. In such a construction, the unwanted mode conversion intensity to the in-phase mode is increased.

On the other hand, in the present embodiment, Gb is prescribed to be smaller than Gs, thereby enhancing the coupling between the two lines composing the differential transmission line. When the coupling between the signal conductors is enhanced, the odd mode becomes more likely to occur in a curved region of the differential transmission line than the even mode, whereby the unwanted mode conversion becomes likely to be suppressed.

Figure 16A:
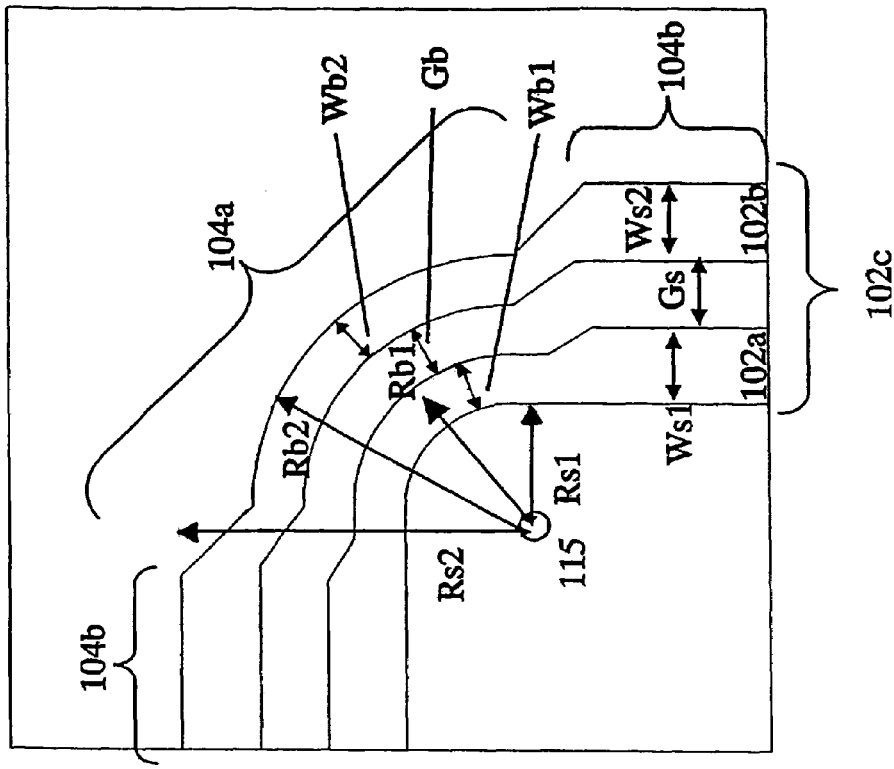
FIGS. 16A and 16B are upper plan views of differential transmission lines (Comparative Example) which are different from the differential transmission line according to Embodiment 3.
Figure 16B:
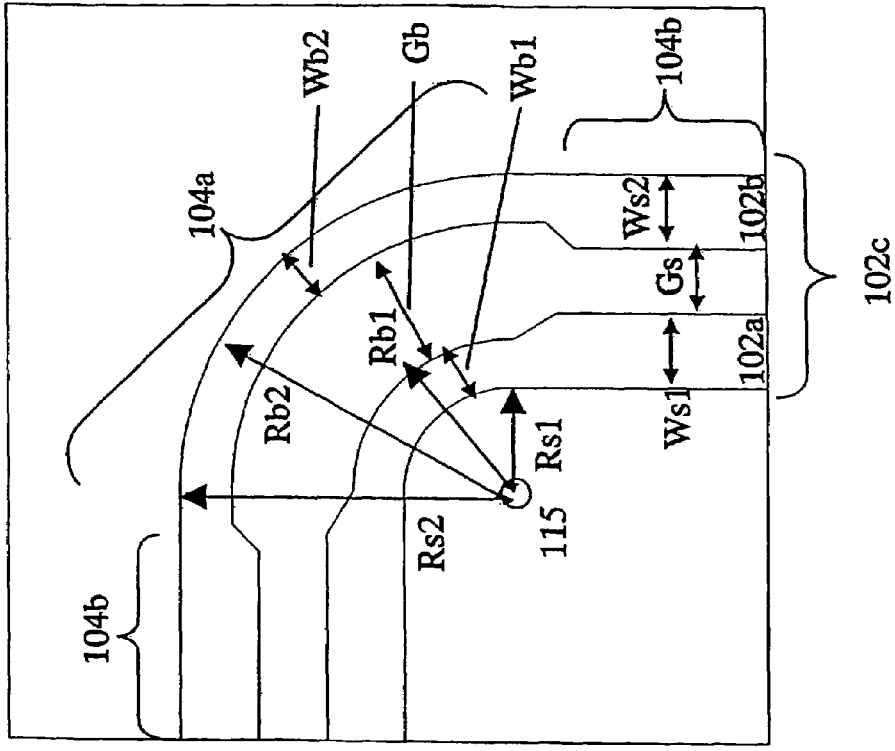

However, even if the line widths and the gap width between the lines are decreased in the curved region 104a, unwanted mode conversion to the in-phase mode is not suppressed in the construction shown in FIG. 16B. Moreover, although it may be effective to decrease the gap width between the lines, there are limits to narrowing when a realistic fabrication process is employed.

In the present embodiment, the condition Rb1>Rs1 is additionally employed to realize conditions for compensating for the difference in electrical length between the signal conductors 102a and 102b in the curved region 104a, thus exhibiting an effect of suppressing unwanted mode conversion. Specifically, a line edge of the first signal conductor 102a (i.e., the inner signal conductor in the curved region 104a) that is closer to the center of curvature is shifted in a direction of increasing the radius of curvature in at least a part of the curved region 104a.

In order not to occupy an increased area in the circuitry, it is preferable to additionally introduce the condition Rb2≦Rs2. Therefore, as shown in FIG. 13, it is preferable that Rb2 is equal to Rs2, and that the first signal conductor 102a is brought closer to the second signal conductor 102b by the total of: the amount reduced from the line widths of the signal conductors 102a and 102b; and the amount reduced from the gap width between the signal conductors 102.

Thus, according to the present embodiment, a difference in electrical length in the curved region 104a of a differential transmission line is reduced through a mere change of positioning of the signal conductors 102, whereby unwanted mode conversion can be suppressed.

Figure 17:
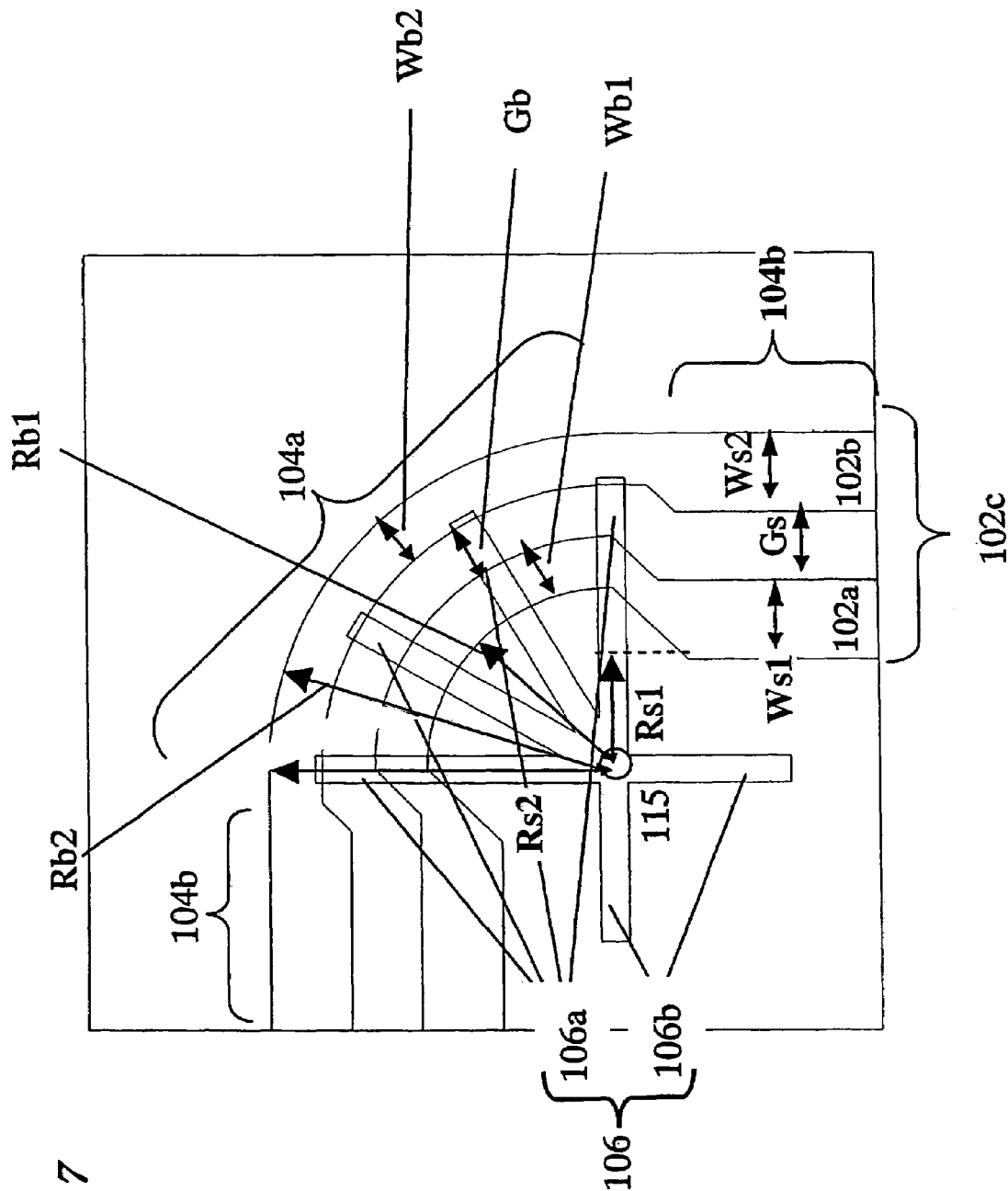
FIG. 17 is an upper see-through view of a differential transmission line which is obtained by combining Embodiments 2 and 3.

The slot complex 106 of the differential transmission lines according to Embodiment 1 or 2 may be additionally introduced in the ground conductor layer 105 of the present embodiment, which will enhance the effect of suppressing unwanted mode conversion. FIG. 17 shows a construction in which the slot complex 106 of Embodiment 2 is provided in the ground conductor layer 105 of the differential transmission line of the present embodiment. With this differential transmission line, particularly good transmission characteristics can be realized.

EXAMPLES

By using as a circuit board a dielectric substrate having a dielectric constant of 3.8 and a total thickness of 200 μm, Examples of differential transmission lines according to the present invention and Conventional Examples of differential transmission lines were produced. A copper layer having a thickness of 40 μm was deposited on the rear face of the circuit board to form a ground conductor layer.

After also depositing a copper layer having a thickness of 40 μm on the front face of the circuit board, desired regions of the copper layer were partially removed through wet etching, thus forming a wiring conductor pattern. Specifically, as a condition corresponding to an odd mode characteristic impedance of 50 Ω, two microstrip lines each having a line width of 230 μm were disposed in parallel to each other, with a gap width of 200 μm between the lines, thus defining a first signal conductor and a second signal conductor of a differential transmission line. The produced circuit structure included a 90° curved region, with a straight region (3 cm long) being connected to each end thereof.

Next, transmission characteristics were evaluated by using a high frequency probe. In frequency bands up to 25 GHz, high frequency measurements were taken on the four terminals, and high-frequency characteristics measurement results were obtained in terms of characteristics of a pair consisting of two single-ended transmission lines. Based on these measurement results, differential transmission line characteristics on the two terminals were determined (data conversion). Through this data conversion, an unwanted mode conversion intensity can be determined. Note that an "unwanted mode conversion intensity" indicates, when a differential signal is input to a differential port, what intensity of in-phase signal is output from the other differential port. These measurements and data processing are commonly-used techniques that are performed when evaluating differential transmission characteristics.

Figure 24A:
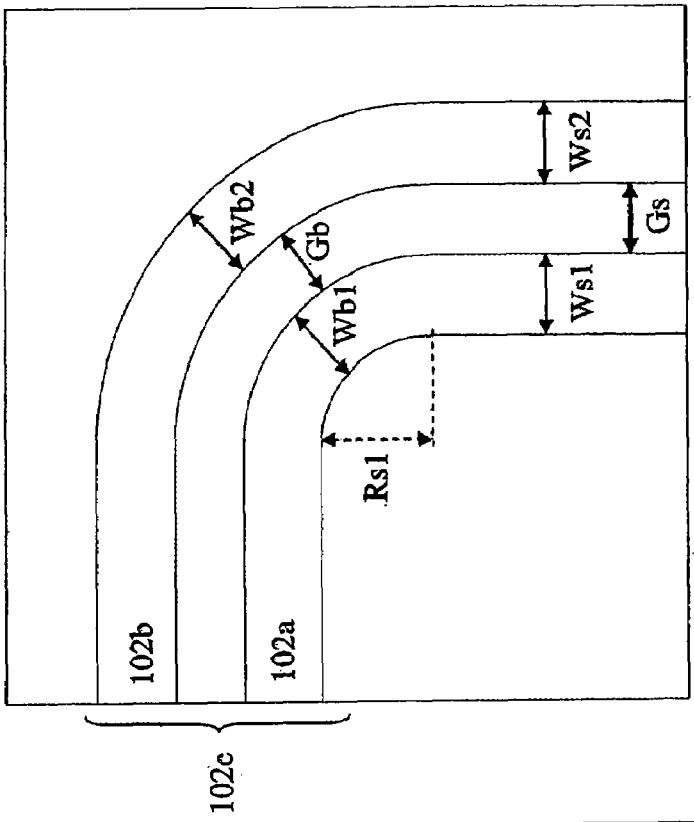
FIG. 24A is an upper plan view of a differential transmission line which is realized by utilizing the technique of Patent Document 1.
Figure 24B:
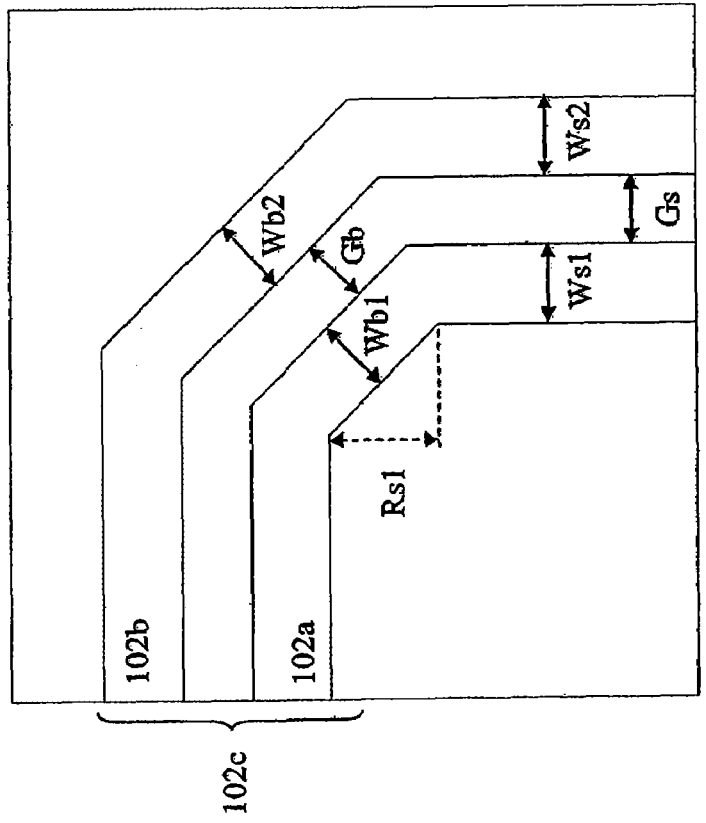
FIG. 24B is an upper plan view of a differential transmission line which is realized by utilizing the technique of Non-Patent Document 3.

Conventional Example 1 has the structure shown in FIG. 24A. Conventional Example 2 has the structure shown in FIG. 24B. In FIGS. 24A and 24B, Rs1 was designated to be 320 μm. The line widths Ws1, Ws2, and the gap width Gs were designated to be equal to the line widths Wb1, Wb2, and the gap width Gb, respectively.

Conventional Example 3 has the structure shown in FIG. 6. In Conventional Example 3, in addition to employing the circuit structure of Conventional Example 2, four slots were provided in the ground conductor layer. The slots were provided in the curved region at equiangular distances, so as to be each orthogonal to the signal transmission direction. The slot width was 80 μm; Ls1 was 250 μm; Ls2 was 850 μm; and the slot length was 600 μm. Note that Ls1 is the shortest distance from the center of curvature 115 of the curved region to the slot 106c region, whereas Ls2 is the distance from the center of curvature 115 to the most distant point in the slot 106c region. The difference between Ls1 and Ls2 corresponds to the slot length.

As seen from a comparison between the characteristics of Conventional Examples at 10 GHz, Conventional Example 1 exhibited an unwanted mode conversion of −16.2 dB, whereas Conventional Examples 2 and 3 exhibited that of −18.5 dB and −18.4 dB, respectively. At 20 GHz, Conventional Example 1 exhibited an unwanted mode conversion of −10.2 dB, whereas Conventional Examples 2 and 3 exhibited that of −12.6 dB.

Table 1 summarizes the unwanted mode conversion characteristics of Conventional Examples 1 to 3.

TABLE 1

| frequency | Conventional Ex. 1 | Conventional Ex. 2 | Conventional Ex. 3 |
|---|---|---|---|
| 10 GHz | −16.2 dB | −18.5 dB | −18.4 dB |
| 20 GHz | −10.2 dB | −12.6 dB | −12.6 dB |

As can be seen from the above results, Conventional Example 1 exhibited a stronger unwanted mode conversion than Conventional Examples 2 and 3. Moreover, Conventional Examples 2 and 3 hardly showed any difference in their characteristics in other frequency bands.

Hereinafter, Examples of the present invention will be described in comparison with Conventional Example 2 or 3.

As Example 1 of the present invention, a differential transmission line having a curved region of the structure shown in FIG. 1 was produced. In Example 1, Ls2 corresponds to the slot length, unlike in Conventional Example 3; nonetheless, the value of Ls2 was designated to be 850 μm, which is equal to that of Conventional Example 3. The other parameters were also identical to those of Conventional Example 3.

In Example 1, unwanted mode conversion of −19.5 dB at 10 GHz and −13.4 dB at 20 GHz was measured. Including any other frequency band subjected to measurement, the characteristics of Example 1 always showed an improvement of about 1 dB over those of Conventional Example 3, indicative of advantageous effects of the present invention.

Next, as Example 2 of the present invention, a differential transmission line having the structure shown in FIG. 7A was produced. In Example 2, circuit elements which are identical to those of Example 1 had the same parameter values. The second slots 106b each had a length of 1.5 mm. The slot width of each second slot was designated equal to that of each first slot.

Example 2 exhibited unwanted mode conversion of −22.2 dB at 10 GHz and −18.4 dB at 20 GHz. Thus, as compared against Conventional Example 3, unwanted mode conversion suppression of 3.7 dB at 10 GHz and 5.8 dB at 20 GHz were obtained.

Table 2 summarizes the unwanted mode conversion characteristics of Examples 1 and 2 and Conventional Example 3.

TABLE 2

| frequency | Conventional Ex. 3 | Example 1 | Example 2 |
|---|---|---|---|
| 10 GHz | −18.4 dB | −19.5 dB | −22.2 dB |
| 20 GHz | −12.6 dB | −13.4 dB | −18.4 dB |

Figure 18:
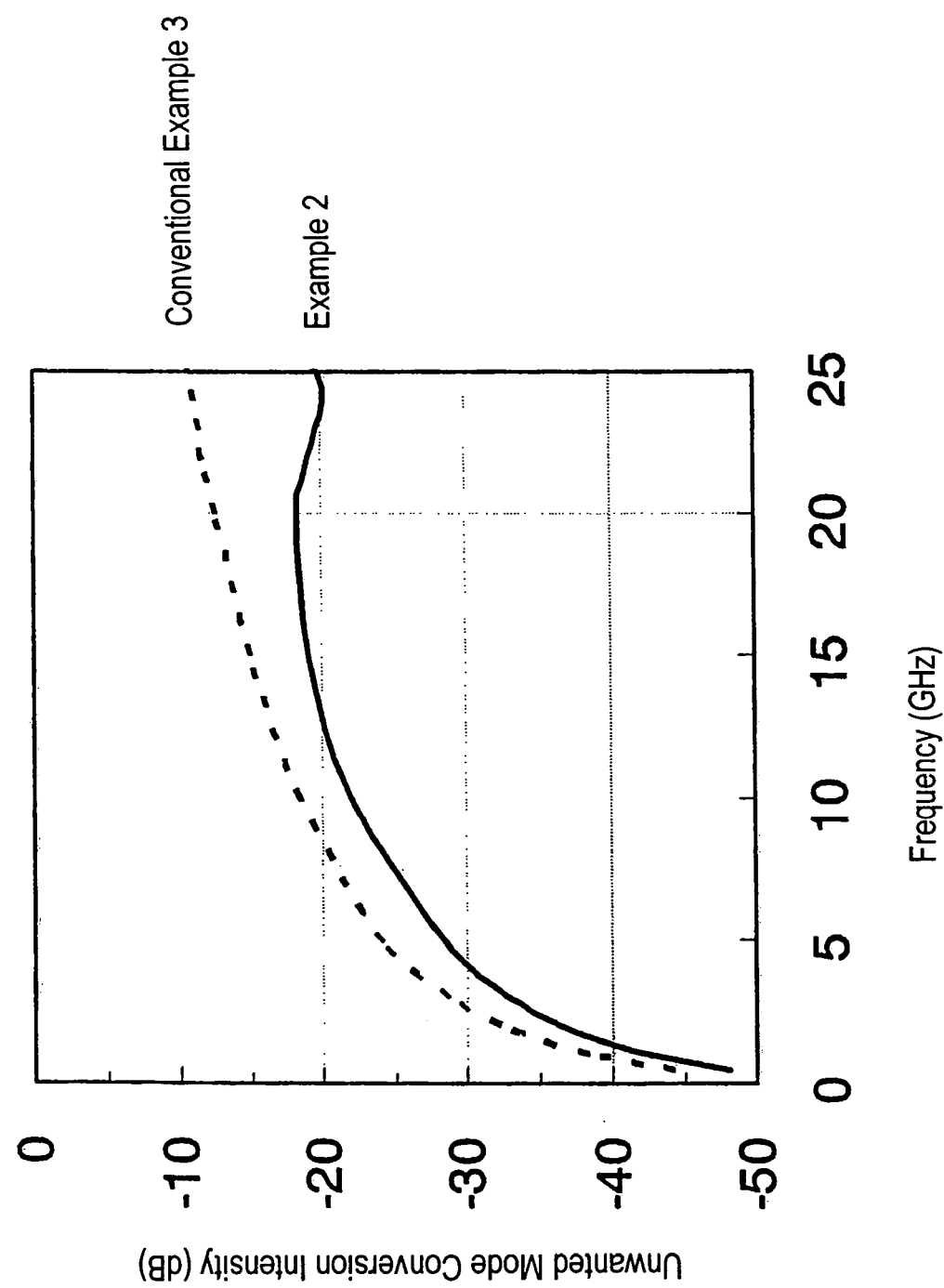
FIG. 18 is a graph showing comparison in the frequency dependence of unwanted mode conversion characteristics between Example 2 of the present invention and Conventional Example 3.

FIG. 18 is a graph showing frequency dependence of unwanted mode conversion intensity with respect to Example 2 and Conventional Example 3. As is clear from FIG. 18, in all frequency bands subjected to measurement, Example 2 exhibited better characteristics than those of Conventional Example 3.

Next, Comparative Example 2a having the structure shown in FIG. 12A was produced. Comparative Example 2a has an almost identical structure to that of Example 2, except that the second slots 106b, which are connected to the first slots 106a in Example 2, are separated by a ground conductor having a width of 100 μm in Comparative Example 2a. The second slots had a slot length of 900 μm.

Comparative Example 2a exhibited unwanted mode conversion of −19.6 dB at 10 GHz and −13.3 dB at 20 GHz. The measured characteristics of Comparative Example 2a were almost identical to those of Example 1, and in all frequency bands subjected to measurement, there was only a difference within ±0.2 dB from Example 1.

The characteristics of Example 2 and Comparative Example 2a indicate how important it is in Embodiment 2 that the second slots are connected to the first slots.

Next, Comparative Example 2b having the structure shown in FIG. 12B was produced. Comparative Example 2b has the structure of Example 2 except that the first slots 106a are eliminated. The other design parameters, including the second slots, are identical to the design parameters of Example 2.

Comparative Example 2b exhibited unwanted mode conversion of −18.6 dB at 10 GHz and −12.5 dB of 20 GHz. The measured characteristics were almost identical to those of Conventional Examples 2 and 3. In all frequency bands subjected to measurement, there was only a difference within ±0.2 dB from Conventional Example 2 or 3, which is within the bounds of measurement error.

From the above results, it was found that the second slots alone would not provide the effect of suppressing unwanted mode conversion.

Next, as Example 3 of the present invention, a differential transmission line having the structure shown in FIG. 13 was produced.

Example 3 is similar in structure to Conventional Example 2, except that the values of Wb1 and Wb2 were decreased from 230 μm (designated in Conventional Example 2) to 150 μm; the value of Gb was decreased from 200 μm (designated in Conventional Example 2) to 150 μm; and conversely, the value of Rb1 was increased from 320 μm (designated in Conventional Example 2) to 530 μm. Rb2 remained at 980 μm as in Conventional Example 2.

Example 3 exhibited unwanted mode conversion of −22.7 dB at 10 GHz and −16.6 dB at 20 GHz.

Relative to the results of Conventional Example 2, the above results would correspond to an unwanted mode suppression of 4.2 dB at 10 GHz and 4 dB at 20 GHz.

Table 3 summarizes the unwanted mode conversion characteristics of Example 3 and Conventional Example 2.

TABLE 3

| frequency | Conventional Ex. 2 | Example 3 |
|---|---|---|
| 10 GHz | −18.5 dB | −22.7 dB |
| 20 GHz | −12.6 dB | −16.6 dB |

Figure 19:
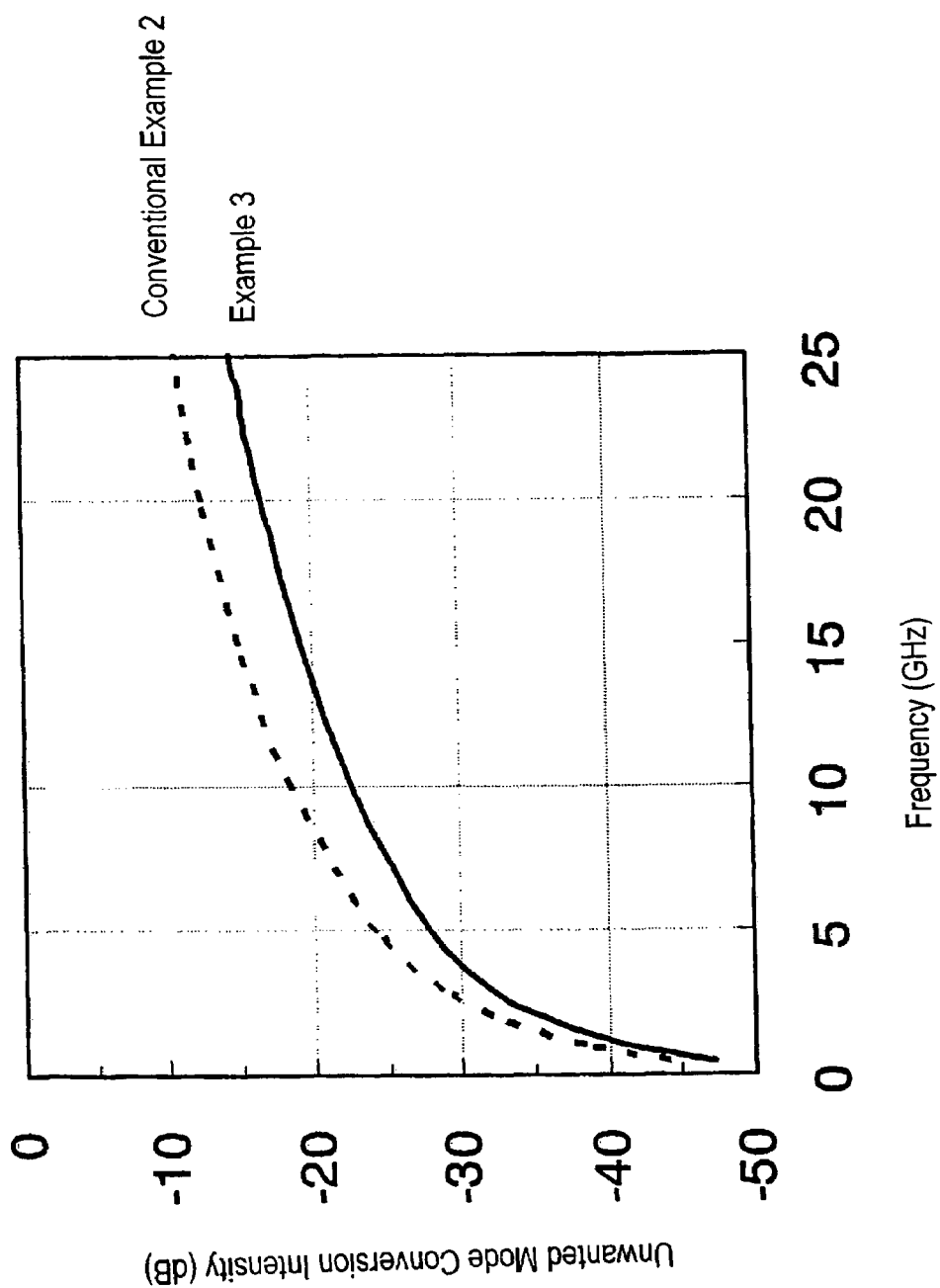
FIG. 19 is a graph showing comparison in the frequency dependence of unwanted mode conversion characteristics between Example 3 of the present invention and Conventional Example 2.

Furthermore, FIG. 19 shows frequency dependence of unwanted mode conversion intensity with respect to Example 3 and Conventional Example 2. As is clear from FIG. 19, in all frequency bands subjected to measurement, Example 3 exhibited better characteristics than those of Conventional Example 2.

Also, Comparative Example 3a having the structure shown in FIG. 16A was produced. In Comparative Example 3a, Wb1 and Wb2 in the curved region were designated to the same values as those in Example 3, but Gb was increased from 150 μm to 360 μm. Conversely, Rb1 was decreased from 530 μm (designated in Example 3) to 320 μm (designated in Conventional Example 2). Rb2 remained at 980 μm as in Conventional Example 2.

Comparative Example 3a exhibited unwanted mode conversion of −17.2 dB at 10 GHz and −11.1 dB at 20 GHz. Relative to the results of Conventional Example 2, the above results would correspond to a deterioration in unwanted mode conversion characteristics of 1.3 dB at 10 GHz and 1.5 dB at 20 GHz. In all frequency bands subjected to measurement, Comparative Example 3a exhibited deteriorated characteristics as compared to the characteristics of Conventional Example 2, thus indicating that the effects of the present invention cannot be obtained with Comparative Example 3a.

Furthermore, Comparative Example 3b having the structure shown in FIG. 16B was produced. In Comparative Example 3b, Wb1 and Wb2 in the curved region and Rb1 were designated to the same values as those in Comparative Example 3a, but Gb was decreased back to 150 μm. In accordance with this change, Rb2 was decreased from 980 μm (designated in Comparative Example 3a) to 770 μm.

Comparative Example 3b exhibited unwanted mode conversion of −18.6 dB at 10 GHz and −12.4 dB at 20 GHz. Relative to the results of Conventional Example 2, these values were all within the range of ±0.2 dB, and no significant differences were observed in any of the frequency bands subjected to measurement. Thus, it was found that the advantageous effects of the present invention cannot be obtained with the structure of Comparative Example 3b.

Thus, through comparison of the results of Comparative Examples 3a and 3b and the results of Example 3, it was proven that the construction of Embodiment 3 provides an effect of suppressing unwanted mode conversion.

Next, Example 4 of the present invention having the structure shown in FIG. 17 was produced. Example 4 is a combination of Examples 2 and 3, whose circuit elements have the same parameters as those in Examples 2 and 3.

Example 4 exhibited unwanted mode conversion of −28.6 dB at 10 GHz and −25.6 dB at 20 GHz. Relative to the results of Conventional Example 2, the above results would correspond to unwanted mode suppression as much as 10.1 dB at 10 GHz and 13 dB at 20 GHz.

Table 4 summarizes the unwanted mode conversion characteristics of Example 4 and Conventional Example 2, as well as Examples 2 and 3.

TABLE 4

| frequency | Conventional Ex. 2 | Example 4 | Example 2 | Example 3 |
|---|---|---|---|---|
| 10 GHz | −18.5 dB | −28.6 dB | −22.2 dB | −22.7 dB |
| 20 GHz | −12.6 dB | −25.6 dB | −18.4 dB | −16.6 dB |

Figure 20:
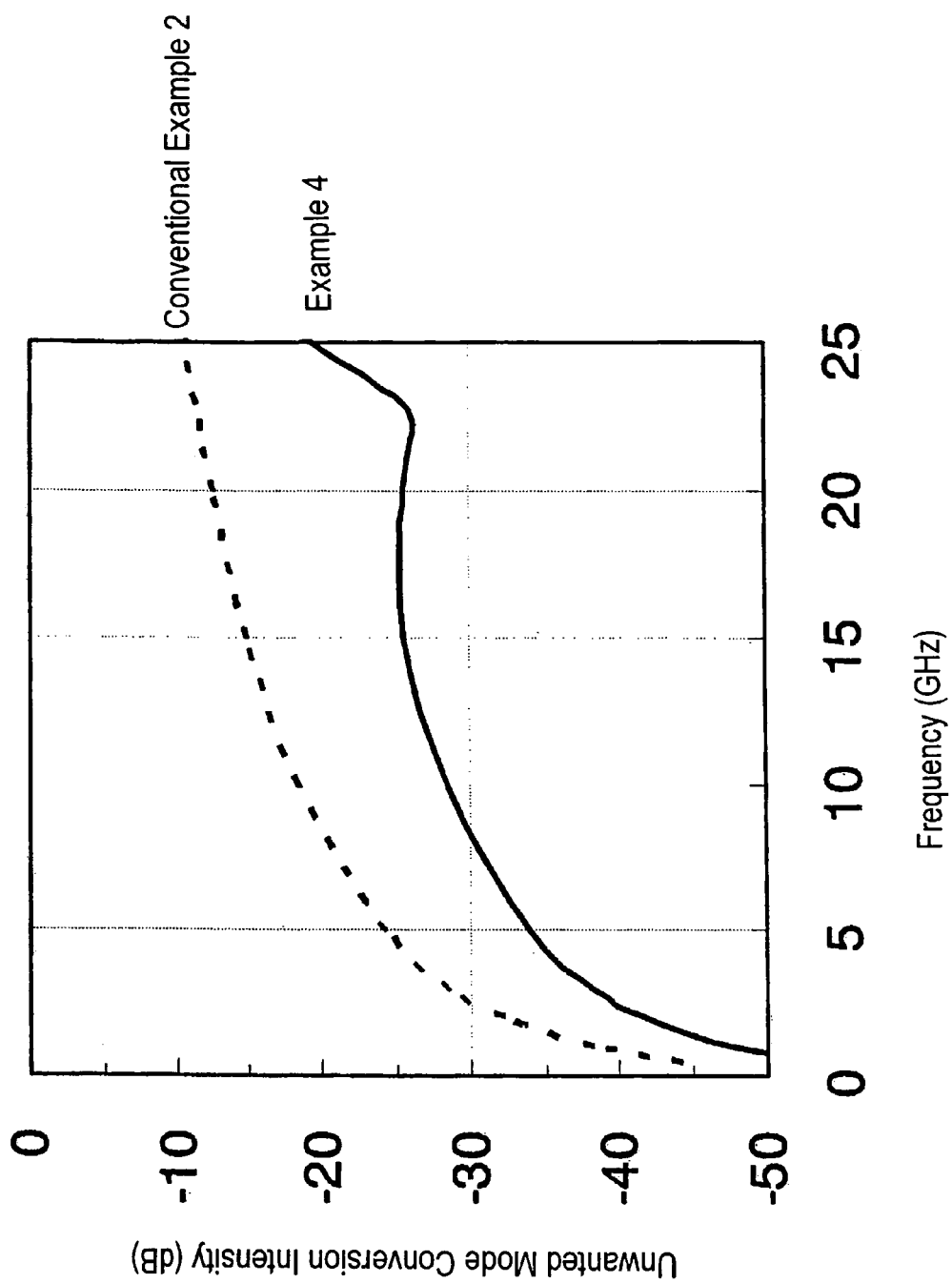
FIG. 20 is a graph showing comparison in the frequency dependence of unwanted mode conversion characteristics between Example 4 of the present invention and Conventional Example 2.
Figure 22:
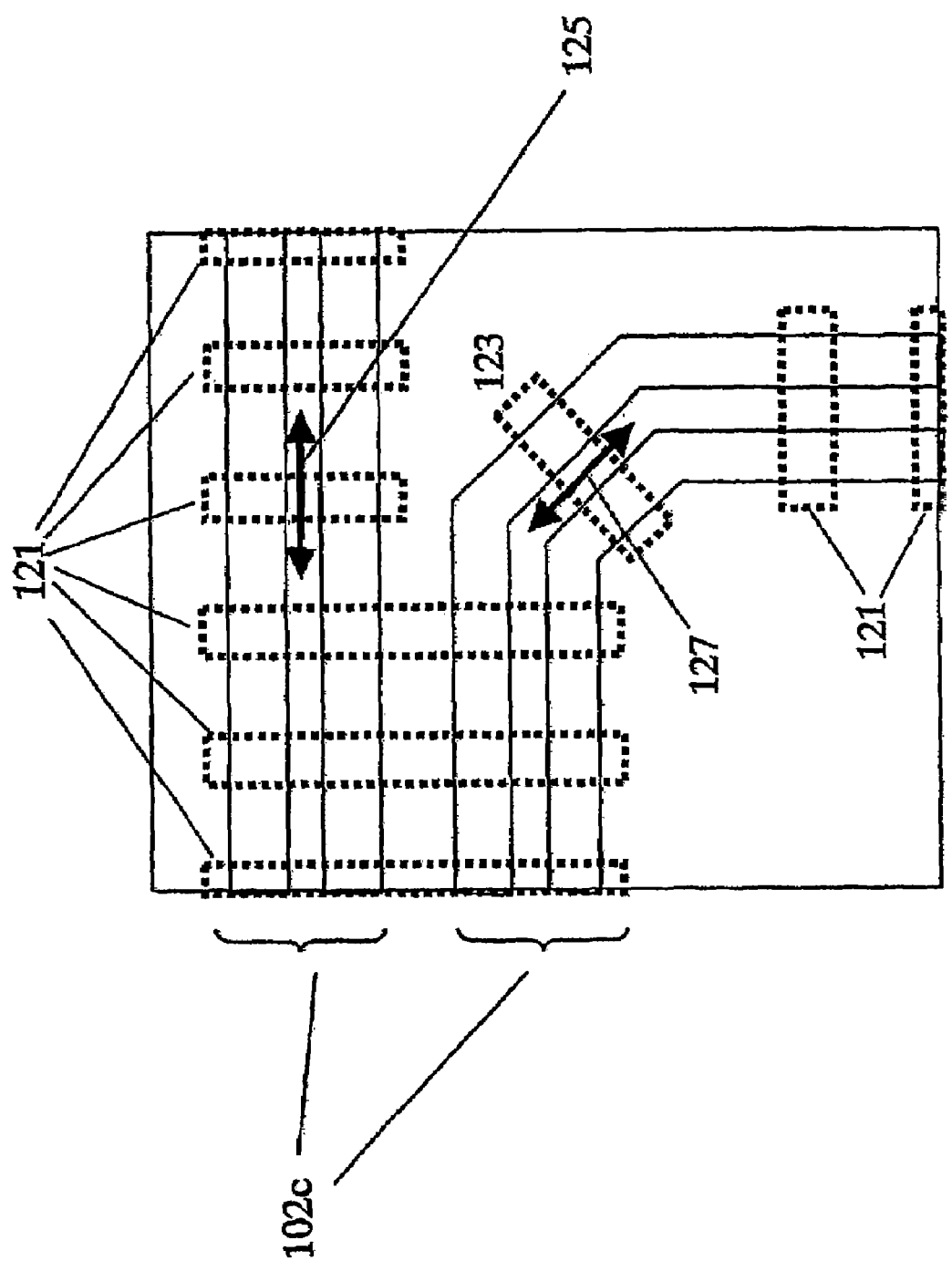
FIG. 22 is an upper see-through view of a differential transmission line disclosed in Patent Document 1.

Furthermore, FIG. 20 shows frequency dependence of unwanted mode conversion intensity with respect to Example 4 and Conventional Example 2. As is clear from FIG. 20, in all frequency bands subjected to measurement, Example 4 exhibited a characteristic improvement of about 10 dB from the characteristics of Conventional Example 2. Thus, it was proven that a drastic characteristic improvement effect can be obtained with the combination of Embodiments 2 and 3.

In accordance with a differential transmission line of the present invention, an unwanted mode conversion which would occur in a curved region of a conventional differential transmission line can be suppressed, thus making it possible to reduce the amount of unwanted radiation from an electronic device.

It is not necessary to employ a filter for removing the in-phase mode, which would be introduced in a conventional differential transmission line for removal of the unwanted mode. This provides effects such as: cost reduction, reduction of occupied area in the circuitry, improvement in the intensity of the differential mode passing signal which may have been deteriorated by the insertion of an in-phase mode filter.

The present invention is not only applicable to data transmission, but is broadly applicable as a circuit structure for use in equipment and devices in the field of communications, such as filters, antennas, phase shifters, switches, and oscillators, and can also be used in various fields utilizing wireless techniques, e.g., power line communication and ID tags.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A differential transmission line comprising:

a substrate;

a ground conductor layer disposed on a rear side of the substrate; and a first signal conductor and a second signal conductor disposed in parallel to each other on a front side of the substrate, the first signal conductor and the ground conductor layer composing a first transmission line, and the second signal conductor and the ground conductor layer composing a second transmission line, wherein, the differential transmission line includes two straight regions in which the first and second transmission lines extend linearly and a curved region interconnecting the two straight regions;

the first signal conductor is disposed in a position relatively close to a center of curvature of the curved region, and the second signal conductor is disposed in a position relatively far from the center of curvature;

in the curved region, a plurality of slots which are orthogonal to a local signal transmission direction are provided in the ground conductor layer; and the plurality of slots intersect the first signal conductor, the plurality of slots being connected to one another on an inner side of curvature of the curved region.

2. The differential transmission line of claim 1, wherein at least one second slot is provided in the ground conductor layer, the at least one second slot being connected to one of the plurality of slots on an inner side of curvature of the curved region.

3. The differential transmission line of claim 2, wherein the second slot at least one extends in a direction away from the first signal conductor with respect to the center of curvature.

4. The differential transmission line of claim 2, wherein the second slot at least one does not intersect signal transmission directions in the straight regions.

5. The differential transmission line of claim 2, comprising a plurality of said second slots.

6. A differential transmission line comprising:

a substrate;

a ground conductor layer disposed on a rear side of the substrate; and a first signal conductor and a second signal conductor disposed in parallel to each other on a front side of the substrate, the first signal conductor and the ground conductor layer composing a first transmission line, and the second signal conductor and the ground conductor layer composing a second transmission line, wherein, the differential transmission line includes two straight regions in which the first and second transmission lines extend linearly and a curved region interconnecting the two straight regions;

the first signal conductor is disposed in a position relatively close to a center of curvature of the curved region, and the second signal conductor is disposed in a position relatively far from the center of curvature;

in the curved region, at least one first slot which is orthogonal to a local signal transmission direction and intersects the first signal conductor is provided in the ground conductor layer; and at least one second slot which is connected to the first slot on an inner side of curvature of the curved region is provided in the ground conductor layer, the second slot at least one extending in a direction away from the first signal conductor with respect to the center of curvature.

7. The differential transmission line of claim 6, wherein the at least one second slot comprises a plurality of the second slots.

8. The differential transmission line of claim 6, wherein the at least one first slot comprises a plurality of the first slots.

* * * * *

UNITED STATES PATENT AND TRADEMARK OFFICE
CERTIFICATE OF CORRECTION

| | | |
|---|---|---|
| PATENT NO. | : 7,301,418 B2 | Page 1 of 1 |
| APPLICATION NO. | : 11/601707 | |
| DATED | : November 27, 2007 | |
| INVENTOR(S) | : Hiroshi Kanno et al. | |

It is certified that error appears in the above-identified patent and that said Letters Patent is hereby corrected as shown below:

On the title page of the Letters Patent and Col. 1,

Under section (54), change "DIFFERENTIAL TRANSMISSION LINE HAVING CURVED DIFFERENTIAL CONDUCTORS AND GROUND PLANE SLOTS" to -- DIFFERENTIAL TRANSMISSION LINE --

Under "What is claimed is:, column 19, line 13, and line 17, change "the second slot at least one" to -- the at least one second slot --

Under "What is claimed is:, column 20, lines 18 to 19, change "the second slot at least one" to -- the at least one second slot --

Signed and Sealed this

Twenty-fourth Day of June, 2008

JON W. DUDAS
*Director of the United States Patent and Trademark Office*